(12) United States Patent
Yang et al.

(10) Patent No.: US 12,219,796 B2
(45) Date of Patent: Feb. 4, 2025

(54) DISPLAY SUBSTRATE HAVING A BLOCKING DAM PROVIDED WITH AT LEAST ONE GROOVE AND MANUFACTURING METHOD THEREFOR, AND DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Bingwei Yang, Beijing (CN); Mingxing Li, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 673 days.

(21) Appl. No.: 17/420,104

(22) PCT Filed: Aug. 4, 2020

(86) PCT No.: PCT/CN2020/106870
§ 371 (c)(1),
(2) Date: Jun. 30, 2021

(87) PCT Pub. No.: WO2021/023189
PCT Pub. Date: Feb. 11, 2021

(65) Prior Publication Data
US 2022/0085330 A1     Mar. 17, 2022

(30) Foreign Application Priority Data
Aug. 6, 2019 (CN) .......................... 201910722165.2

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/122* (2023.02); *H10K 59/124* (2023.02);
(Continued)

(58) Field of Classification Search
CPC .. H10K 50/84; H10K 50/8426; H10K 50/844; H10K 59/124; H10K 59/122
See application file for complete search history.

(56) References Cited

U.S. PATENT DOCUMENTS

2017/0207418 A1* 7/2017 Shin .................. H10K 59/8731
2019/0179466 A1 6/2019 Kim et al.
(Continued)

FOREIGN PATENT DOCUMENTS

CN  106601781 A  4/2017
CN  106711171 A  5/2017
(Continued)

OTHER PUBLICATIONS

"Photoresist ashing, stripping, and descum. Organic Contamination Removal for Silicon Wafer" from PIE Scientific; published in 2016; ("PIESCI"); URL: <http://web.archive.org/web/20160616071735/https://piescientific.com/application_pages/applications_silicon_wafer/> (Year: 2016).*
(Continued)

*Primary Examiner* — Steven M Christopher
*Assistant Examiner* — Tyler J Wiegand
(74) *Attorney, Agent, or Firm* — IP & T GROUP LLP

(57) ABSTRACT

A display substrate has an active area and a frame region located at at least one side of the active area. The display substrate includes a substrate, pixel units, at least one
(Continued)

blocking dam and a first encapsulation layer. The pixel units is disposed on the substrate and located in the active area. The at least one blocking dam is disposed on the substrate and located in the frame area. The at least one blocking dam is provided with at least one groove on a surface thereof facing away from the substrate, a depth direction of the at least one groove is perpendicular to the substrate, and an extending direction of the at least one groove is substantially the same as an extending direction of the blocking dam provided with the at least one groove. The first encapsulation layer covers the at least one blocking dam.

12 Claims, 13 Drawing Sheets

(51) Int. Cl.
    *H10K 59/122*     (2023.01)
    *H10K 59/124*     (2023.01)
    *H10K 71/00*     (2023.01)
    *H10K 71/20*     (2023.01)

(52) U.S. Cl.
    CPC ........... *H10K 71/00* (2023.02); *H10K 71/233* (2023.02); *H10K 59/1201* (2023.02)

(56) References Cited

U.S. PATENT DOCUMENTS

2019/0198587 A1    6/2019   Park et al.
2019/0363275 A1*   11/2019   Ochi .................... H10K 50/125
2020/0006700 A1*   1/2020   Kim ....................... H10K 59/87
2020/0212354 A1*   7/2020   Zhang ................. H10K 59/122
2021/0226162 A1    7/2021   Qian et al.
2021/0359258 A1    11/2021   Guo

FOREIGN PATENT DOCUMENTS

| CN | 109256481 A | 1/2019 |
| CN | 109273510 A | 1/2019 |
| CN | 109301084 A | 2/2019 |
| CN | 109585676 A | 4/2019 |
| CN | 109888126 A | 6/2019 |
| CN | 110021635 A | 7/2019 |
| CN | 110416434 A | 11/2019 |
| KR | 10-2019-0030951 A | 3/2019 |
| KR | 109786578 A | 5/2019 |
| KR | 10-2019-0065757 A | 6/2019 |
| KR | 10-2019-0070424 A | 6/2019 |

OTHER PUBLICATIONS

First Office Action of Priority Application No. CN 201910722165.2 issued by the Chinese Patent Office on Mar. 1, 2021.

Notification to Grant Patent Right for Invention of Priority Application No. CN 201910722165.2 issued by the Chinese Patent Office on Oct. 29, 2021.

* cited by examiner

A2-B2

A4-B4

A5-B5

DISPLAY SUBSTRATE HAVING A BLOCKING DAM PROVIDED WITH AT LEAST ONE GROOVE AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2020/106870 filed on Aug. 4, 2020, which claims priority to Chinese Patent Application No. 201910722165.2, filed on Aug. 6, 2019, which are incorporated herein by reference in their entirety.

TECHNICAL FIELD

The present disclosure relates to the field of display technologies, and in particular, to a display substrate and a manufacturing method therefor, and a display device.

BACKGROUND

With the popularization of electronic display products, the adaptive capacity of electronic display products to the environment has attracted more and more attention from users.

SUMMARY

In one aspect, a display substrate is provided. The display substrate has an active area and a frame area located at at least one side of the active area. The display substrate includes a substrate, pixel units, at least one blocking dam and a first encapsulation layer. The pixel units are disposed on the substrate and located in the active area. The at least one blocking dam is disposed on the substrate and located in the frame area. At least one groove is provided on a surface of the at least one blocking dam facing away from the substrate. A depth direction of the at least one groove is perpendicular to the substrate, and an extending direction of the at least one groove is substantially the same as an extending direction of the at least one blocking dam provided with the at least one groove. The first encapsulation layer covers the at least one blocking dam.

In some embodiments, a portion of the first encapsulation layer covering the at least one groove is conformal to the at least one groove.

In some embodiments, the at least one of the blocking dam provided with the at least one groove includes a second pattern layer and a first pattern layer that are sequentially stacked on the substrate, and the at least one groove is located in the first pattern layer.

In some embodiments, the display substrate further includes an isolation column located in the active area. The isolation column and the first pattern layer are formed by patterning the same film layer.

In some embodiments, the display substrate further includes a pixel defining layer located in the active area. The pixel defining layer and the second pattern layer are formed by patterning the same film layer.

In some embodiments, the display substrate further includes a planarization layer covering at least the active area. The at least one blocking dam further includes a third pattern layer between the second pattern layer and the substrate, and the planarization layer and the third pattern layer are formed by patterning the same film layer.

In some embodiments, the at least one blocking dam includes at least two blocking dams, and the at least two blocking dams include a first blocking dam and a second blocking dam. The first blocking dam is located between the active area and the second blocking dam. The first blocking dam includes the first pattern layer and the second pattern layer; the display substrate further comprises a planarization layer covering at least the active area; and the second blocking dam includes the first pattern layer, the second pattern layer and a third pattern layer; the third pattern layer is located between the second pattern layer and the substrate, and the planarization layer and the third pattern layer are formed by patterning a same film layer.

In some embodiments, the at least one blocking dam includes at least two blocking dams, and the at least two blocking dams surround the active area and are sequentially arranged from inside to outside. The at least one groove is arranged to surround the active area, and an orthogonal projection of the at least one groove on the substrate is in a closed shape.

In some embodiments, in a direction from a center to an edge of the display substrate, heights of the at least two blocking dams successively increase.

In some embodiments, at least two grooves surrounding the active area are provided in the at least one blocking dam provided with the at least one groove, and the at least two grooves are sequentially arranged from inside to outside.

In some embodiments, a plurality of protruding portions are provided in the at least one groove; and in an extending direction of the at least one groove, the plurality of protruding portions are sequentially arranged at intervals.

In some embodiments, the plurality of protruding portions and a portion of the at least one blocking dam away from the substrate are formed by patterning the same film layer.

In some embodiments, a shape of an orthogonal projection of the plurality of protruding portions on the substrate is at least one of a triangle, a rectangle, a polygon or a circle.

In some embodiments, the display substrate further includes a second encapsulation layer and a third encapsulation layer. The second encapsulation layer is located above a side of the first encapsulation layer away from the substrate, and the second encapsulation layer covers the active area and the at least one blocking dam. The third encapsulation layer is located between the first encapsulation layer and the second encapsulation layer, and the third encapsulation layer covers at least the active area. An edge of an orthogonal projection of the at least one blocking dam on the substrate away from the active area is located outside an orthogonal projection of the third encapsulation layer on the substrate.

In another aspect, a display device is provided. The display device includes the display substrate as described in any of the above embodiments.

In yet another aspect, a manufacturing method for a display substrate is provided. The method includes: providing a substrate having an active area and a frame area located at at least one side of the active area; forming at least one blocking dam on the substrate and in the frame area, and forming at least one groove on a surface of the at least one blocking dam facing away from the substrate; and forming a first encapsulation layer on the substrate to cover the active area and the at least one blocking dam. A depth direction of the at least one groove is perpendicular to the substrate, and an extending direction of the at least one groove is substantially the same as an extending direction of the at least one blocking dam provided with the at least one groove.

In some embodiments, the at least one blocking dam includes a second pattern layer and a first pattern layer that are sequentially stacked on the substrate, and the at least one groove is formed in the first pattern layer. Forming at least one blocking dam includes: forming a first material layer on the substrate; and patterning the first material layer by using a halftone mask, including: coating photoresist on a surface of the first material layer facing away from the substrate; exposing the photoresist by using the halftone mask and developing the photoresist to form a photoresist all-removed region, a photoresist semi-reserved region and a photoresist all-reserved region; etching the first material layer to remove a portion of the first material layer located in the photoresist all-removed region; removing a portion of the photoresist located in the photoresist semi-reserved region by using an ashing process; etching a portion of the first material layer located in the photoresist semi-reserved region to form the first pattern layer and an isolation column; and stripping remaining photoresist.

In the active area, a portion of the first material layer farther away from the substrate is formed into the isolation column, and another portion of the first material layer closer to the substrate is formed into a pixel defining layer; and in the frame area, a portion of the first material layer farther away from the substrate is formed into the first pattern layer, and another portion of the first material layer closer to the substrate is formed into the second pattern layer.

In some embodiments, the at least one blocking dam includes a second pattern layer and a first pattern layer that are sequentially stacked on the substrate, and the at least one groove is formed in the first pattern layer. Forming at least one blocking dam includes: sequentially depositing a second material layer and a first material layer on the substrate to form stacked layers; and simultaneously patterning the first material layer and the second material layer by using a halftone mask.

A portion of the first material layer located in the active area is formed into an isolation column, and a portion of the first material layer located in the frame area is formed into the first pattern layer; and a portion of the second material layer located in the active area is formed into a pixel defining layer, and a portion of the second material layer located in the frame area is formed into the second pattern layer.

In some embodiments, the at least one blocking dam further includes a third pattern layer between the second pattern layer and the substrate. Forming at least one blocking dam includes: depositing an insulating material film on the substrate to planarize a surface of the substrate; and patterning the insulating material film. A portion of the insulating material film located in the active area is formed into a planarization layer, and a portion of the insulating material film outside the active area is formed into the third pattern layer.

In some embodiments, after forming the first encapsulation layer, the method further includes: coating a liquid including an organic material on a portion of the first encapsulation layer located in the active area; and drying and solidifying the liquid to form a third encapsulation layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

FIG. 10 is another structural diagram of a display substrate, in accordance with some embodiments;

DETAILED DESCRIPTION

Figure 1A:
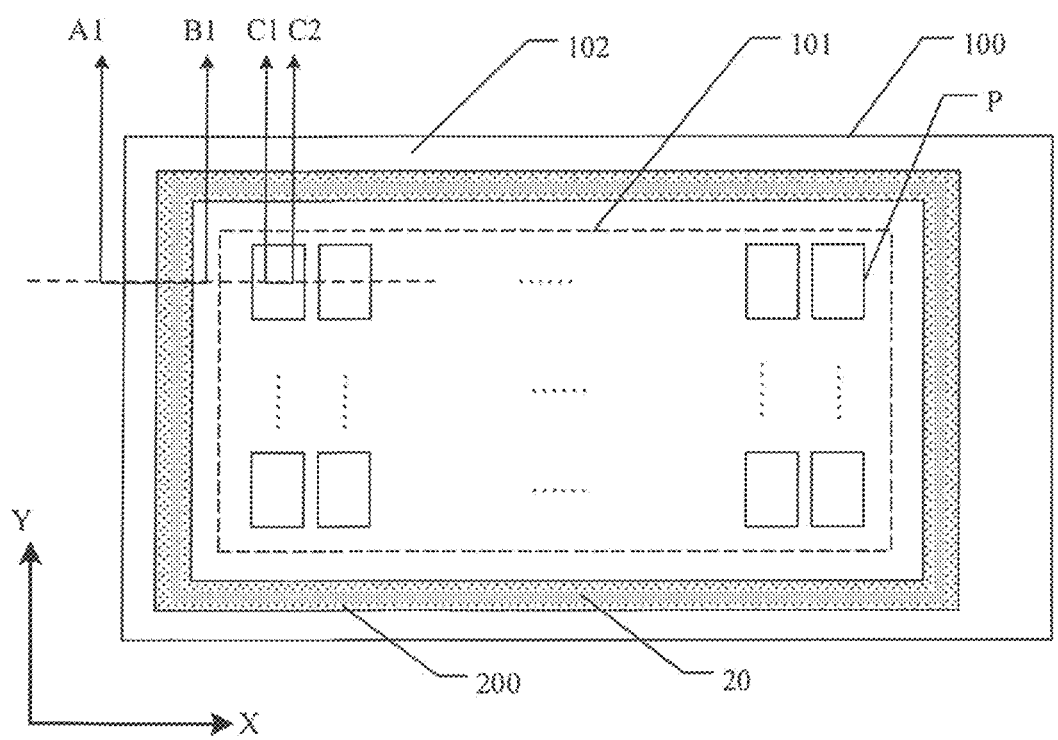
FIG. 1A is a top view of a display substrate, in accordance with some embodiments.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are to be construed in an open and inclusive sense, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, terms "first", "second" and the like are only used for descriptive purposes, and are not to be construed as indicating or implying the relative importance or implicitly indicating the number of indicated technical features. Thus, a feature defined to by "first" or "second" may explicitly or implicitly include one or more of the features. In the description of the embodiments of the present disclosure, the term "a plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term such as "substantially", "about" or "approximately" as used herein includes a stated value and an average value within an acceptable range of deviation of a particular value. The acceptable range of deviation is determined by a person of ordinary skill in the art in view of the measurement in question and the error associated with a particular amount of measurement (i.e., the limitations of the measurement system).

Exemplary embodiments are described herein with reference to sectional views and/or plan views as idealized exemplary drawings. In the drawings, thicknesses of layers and areas are exaggerated for clarity. Therefore, variations in a shape with respect to the drawings due to, for example, manufacturing technology and/or tolerances may be envisaged. Therefore, the exemplary embodiments should not be construed as being limited to shapes of the areas shown herein, but include shape deviations due to, for example, manufacturing. For example, the etched area shown as a rectangle will generally have curved features. Therefore, the areas shown in the drawings are schematic in nature, and their shapes are not intended to show the actual shapes of the areas of the device, and are not intended to limit the scope of the exemplary embodiments.

During the production and use of electronic display products, moisture, oxygen and the like in the external environment may intrude into an interior of electronic display products. For example, moisture, oxygen and the like may react with structures in the electronic display products to affect electrical properties thereof, thereby reducing properties and lifespans of the electronic display products. In this regard, although various manufacturers have developed a variety of encapsulation technologies, current encapsulation technologies cannot meet the further demands of customers for encapsulation effects of electronic display products.

For a display substrate, e.g., a flexible organic light-emitting diode (OLED) display substrate, a level of encapsulation process determines the lifespans of devices therein. Blocking dams are provided on the display substrate to form an encapsulation structure (e.g., a third encapsulation layer in the following embodiments, such as an organic encapsulation layer), but an arrangement of the blocking dams needs to occupy a design area of a frame area of the display substrate. In some embodiments, a narrow-frame design of the display substrate may be realized by reducing the number of blocking dams, e.g., by providing only one blocking dam. However, reducing the number of blocking dams may reduce an encapsulation effect of the display substrate, and may result in problems such as a shortened lifespan and a poor display of the display substrate.

Embodiments of the present disclosure provide a display substrate. The display substrate has an active area and a frame area around the active area. The display substrate includes a substrate, pixel units, at least one blocking dam and a first encapsulation layer. The pixel units are disposed on the substrate and located in the active area. The at least one blocking dam is disposed on the substrate and located in the frame area. At least one groove is provided on a surface of the at least one blocking dam facing away from the substrate. A depth direction of the at least one groove is perpendicular to the substrate. An extending direction of the at least one groove is substantially the same as an extending direction of the blocking dam(s) provided with the at least one groove. The first encapsulation layer covers the blocking dam(s). For example, the first encapsulation layer is an inorganic encapsulation layer.

In this case, the groove(s) may increase a contact area between the blocking dam(s) and the first encapsulation layer, thereby improving a bonding strength of the blocking dam and the first encapsulation layer, prolonging paths of crack propagation, moisture and oxygen intrusion, etc., and improving an encapsulation effect of the first encapsulation layer on the display substrate. In addition, in a process of encapsulating the display substrate, a liquid including an encapsulation material is generally coated on to the first encapsulation layer to form a third encapsulation layer. The groove(s) may increase difficulty for the liquid to pass over the blocking dam(s), thereby improving an anti-overflow effect of the blocking dam. That is, compared with an original blocking dam not provided with groove(s), a blocking dam provided with at least one groove may be equivalent to at least two original blocking dams in terms of the anti-overflow effect. In this way, the number of blocking dams designed in the display substrate may be reduced, thereby reducing a width of the frame area of the display substrate, which is beneficial for the display substrate to achieve a narrow-frame design; or, the encapsulation effect of the entire display substrate may be improved without changing the number of blocking dams designed.

Hereinafter, a display substrate, a manufacturing method therefor, and a display device in accordance with at least one embodiment of the present disclosure will be described with reference to the accompanying drawings. It will be noted that, in the at least one embodiment, a spatial rectangular coordinate system is established based on the substrate of the display substrate to describe a position of each structure in the display substrate. In the spatial rectangular coordinate system, an X axis and a Y axis are parallel to a surface of the substrate, and a Z axis is perpendicular to the surface of the substrate.

As shown in FIG. 1A, the display substrate 1 provided by at least one embodiment of the present disclosure has an active area (AA) 101 (an area defined by a dashed frame) and a frame area 102 located around the active area 101. For example, the frame area 102 may be located at least one side outside the active area 101, e.g., the frame area 102 may surround the active area 101.

Figure 1B:
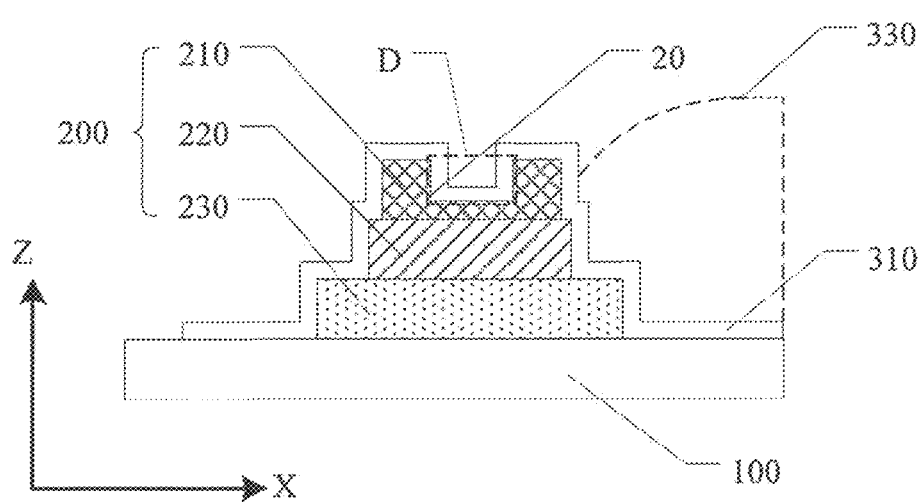
FIG. 1B is a structural diagram of a display substrate, in accordance with some embodiments.

As shown in FIGS. 1A and 1B, The display substrate 1 includes a substrate 100, to pixel units P, at least one blocking dam 200 and a first encapsulation layer 310. The pixel units P are disposed on the substrate 100 and located in the active area 101. The at least one blocking dam 200 is disposed on the substrate 100 and located in the frame area 102.

For example, the substrate 100 may include a rigid base substrate such as glass, or a flexible base substrate such as polyimide (PI). The substrate 100 may also include a film layer (e.g., a buffer layer) provided on the rigid base substrate or the flexible base substrate.

For example, a plurality of pixel units P may be arranged in an array. Each pixel unit P may include a plurality of sub-pixels, and each sub-pixel may include a pixel driving circuit and a light-emitting device. The pixel driving circuit is coupled to the light-emitting device and is used for driving the light-emitting device to emit light.

At least one groove 20 is provided on a surface of the at least one blocking dam 200 facing away from the substrate 100. For example, at least one groove 20 is provided on a surface of one blocking dam 200 facing away from the substrate 100; or at least one groove 20 is provided on a surface of at least one of a plurality of blocking dams 200 facing away from the substrate 100. Herein, a depth direction (e.g., a Z-axis direction) of at least one groove 20 is perpendicular to the substrate 100, and an extending direction of the at least one groove 20 is the same as an extending direction of the blocking dam(s) 200 provided with the at least one groove 20. In addition, the first encapsulation layer 310 covers the blocking dam(s) 200.

For example, a portion of the surface of the at least one blocking dam 200 facing away from the substrate 100 (e.g., a region D shown in FIG. 1B) is recessed toward the substrate 100 in a direction perpendicular to the substrate 100, so as to form the groove. A depth of the groove 20 is more than or equal to a thickness of the first encapsulation layer 310. The first encapsulation layer 310 covers the blocking dam 200, i.e., covers the groove 20, and the first encapsulation layer 310 is in contact with the groove 20. A surface facing away from the substrate 100 of a portion of the first encapsulation layer 310 covering the groove 20 is recessed toward the substrate 100, so that a surface facing away from the substrate 100 of a portion of the first encapsulation layer 310 covering the blocking dam 200 has a segment difference at a position where the groove 20 are located.

As shown in FIG. 1B, when the first encapsulation layer 310 is deposited on the blocking dam 200, a surface of the blocking dam 200 facing away from the substrate 100 has two protrusions due to existence of the groove 20. In a process of forming a third encapsulation layer 330, if a liquid needs to pass over the blocking dam 200, it needs to pass over the two protrusions in sequence. That is, after a boundary of the liquid climbs over a portion of the first encapsulation layer 310 coinciding with a sidewall of the blocking dam 200 proximate to the active area 101 to enter a portion of the first encapsulation layer 310 covering the groove 20, it still needs to climb over a portion of the first encapsulation layer 310 coinciding with another sidewall of the blocking dam 200 away from the active area 101 before it may pass over the blocking dam 200. That is, after the groove 20 is provided, the liquid needs to go through an additional climbing process before it may completely pass over the blocking dam 200. Therefore, the groove 20 increases a difficulty of liquid overflow, and improves the anti-overflow effect of the blocking dam 200.

For example, a portion of the first encapsulation layer 310 covering the at least one groove 20 is conformal to the at least one groove 20. The term "conformal" may mean that two shapes are the same or substantially similar. For example, a surface of the first encapsulation layer 310 in contact with the groove 20 (i.e., a surface of the first encapsulation layer 310 proximate to the substrate 100) is conformal to the groove 20. A surface of the first encapsulation layer 310 facing away from the substrate 100 is conformal to the groove 20. A portion of the first encapsulation layer 310 covering the blocking dam 200 has a recess (e.g., the area D shown in FIG. 1B), a shape of which is similar to a shape of the groove 20.

In at least one embodiment of the present disclosure, a width of the groove 20 may be not less than 5 micrometers (μm), e.g., further not less than 10 μm, 15 μm, 20 μm, etc.

It will be noted that, in at least one embodiment of the present disclosure, a manner in which the groove 20 is formed in the blocking dam 200 is not limited, and may be designed according to a structure of the blocking dam 200.

In at least one embodiment of the present disclosure, the at least one blocking dam provided with groove(s) includes a second pattern layer and a first pattern layer that are sequentially stacked on the substrate, and the groove(s) are located in the first pattern layer. For example, the aforementioned pattern layers may also be referred to as film layers.

For example, as shown in FIGS. 1B and 10, the blocking dam 200 of the display substrate 1 includes a first pattern layer 210 and a second pattern layer 220, and the second pattern layer 220 is located between the first pattern layer 210 and the substrate 100. The groove 20 is formed in the first pattern layer 210. In a practical process, the first pattern layer 210 and the second pattern layer 220 may be formed of two different film layers in different processes. Compared with a current process, forming the groove 20 only in the first pattern layer 210 may not need to consider additional processing for the second pattern layer 220, and the grooves 20 may be simultaneously formed in a process of patterning the first pattern layer 210, which does not increase steps of the manufacturing process of the display substrate 1.

For example, a material of the first pattern layer may be the same as or different from a material of the second pattern layer.

It will be noted that, in at least one embodiment of the present disclosure, in a case where the groove is located in the first pattern layer, both a bottom surface and a sidewall of the groove may be formed by a surface of the first pattern layer. That is, the first pattern layer is not broken at the groove. That is, a depth of the groove is less than a thickness of the first pattern layer, and the groove does not extend through the first pattern layer. For this situation, refer to the groove 20 shown in FIG. 1B. Or the groove extends through the first pattern layer and exposes a top surface (i.e., a surface of the second pattern layer facing away from the substrate) of the second pattern layer. That is, the first pattern layer is broken at the groove. In this case, the sidewall of the groove is formed by the first pattern layer, the bottom surface of the groove is formed by the top surface of the second pattern layer, and the bottom surface of the groove is a portion of the second pattern layer at an interface between the first pattern layer and the second pattern layer. For this situation, refer to the groove 20 shown in FIG. 10.

In at least one embodiment of the present disclosure, the display substrate further includes an isolation column located in the active area. The isolation column and the first pattern layer are configured to be formed by patterning the same film layer.

Figure 1C:
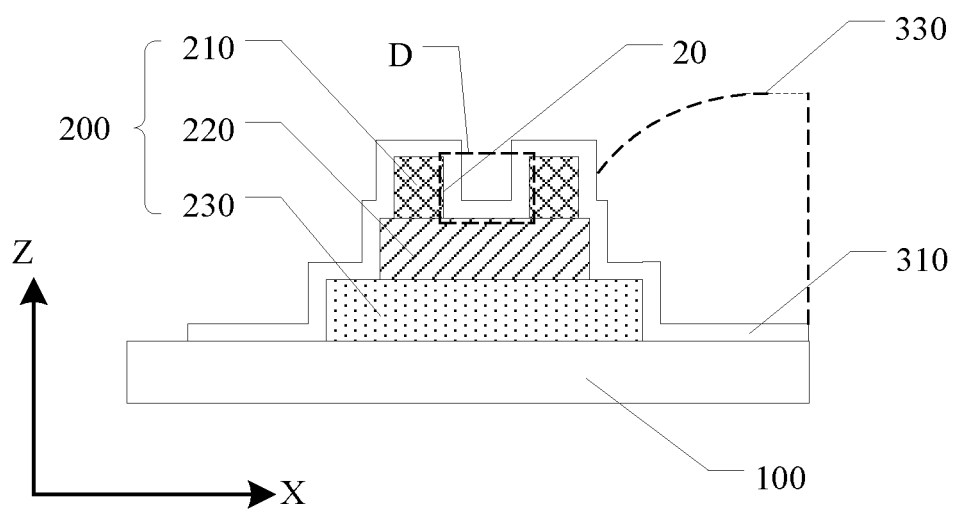
FIG. 1D is a sectional view of the display substrate in FIG. 1A taken along the A1-B1 line and the C1-C2 line.
Figure 1D:
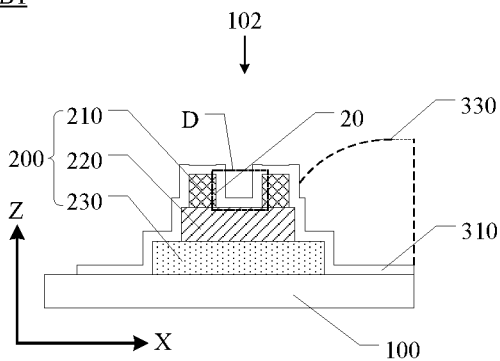
Figure 1D:
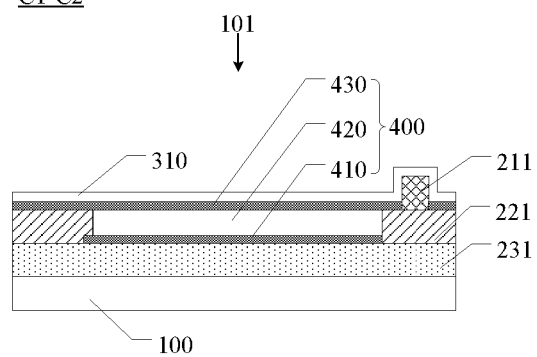

For example, as shown in FIG. 1D, an isolation column 211 is provided in the active area 101 of the display substrate 1, and the first pattern layer 210 and the isolation column 211 are disposed in the same layer and have the same material. For example, in a process of forming the first pattern layer 210 and the isolation column 211, a material layer may be deposited first, and then the material layer is patterned, which may include performing, for example, processes such as exposure, development and etching. A portion of the material layer located in the active area 101 is formed into the isolation column 211, and a portion of the material layer located in the frame area 102 is formed into the first pattern layer 210. In addition, there is a distance between the isolation column 211 and the first pattern layer 210. For example, in the process of forming the first pattern layer 210 and the isolation column 211, the groove 20 may be simultaneously formed. In this way, the formation of the first pattern layer 210 and the groove 20 therein does not increase process steps for manufacturing the display substrate 1, thereby simplifying a production process.

It will be noted that, for the convenience of description, FIG. 1D only illustrates a part of structures (e.g., including a planarization layer, a pixel defining layer and a light-emitting device) in the pixel unit in the active area, while other structures (e.g., a pixel driving circuit) are not illustrated.

In the manufacturing process of the display substrate 1, an evaporation process is required to form some functional layers (e.g., a light-emitting functional layer 420 shown in FIG. 1D) of the display substrate 1. In the evaporation process, the isolation column may be used to support a mask plate (e.g., a fine metal mask plate), so that there is a certain distance between the mask plate (e.g., a mask strip provided with a mask pattern in the mask plate) and a surface of the display substrate (in this case, it is a surface of a portion of the display substrate other than the isolation column) to prevent the mask plate from being completely attached to the surface of the display substrate to cause poor evaporation.

In some embodiments, the display substrate further includes a pixel defining layer in the active area. The pixel defining layer and the second pattern layer are configured to be formed by patterning the same film layer. For example, as shown in FIG. 1D, a pixel defining layer 221 is provided in the active area 101 of the display substrate 1. The second pattern layer 220 and the pixel defining layer 221 are disposed in the same layer and have the same material. For example, in a process of forming the second pattern layer 220 and the pixel defining layer 221, a material layer may be deposited first, and then the material layer may be patterned. A portion of the material layer located in the active area 101 is formed into the pixel defining layer 221, and a portion of the material layer located in the frame area 102 is formed into the second pattern layer 220. In addition, there is a distance between the pixel defining layer 221 and the second pattern layer 220. In this way, the formation of the second pattern layer 220 does not increase the process steps for manufacturing the display substrate 1, thereby simplifying the production process. The pixel defining layer 221 may be used to define regions of sub-pixels of the display substrate 1, for example, as shown in FIG. 1D, it may be used to define a formation position of the light-emitting function layer 420 of the light-emitting device 400.

In some embodiments of the present disclosure, materials of the pixel defining layer and the isolation column may be the same, so that the pixel defining layer and the isolation column may be formed by patterning one film layer. In this way, the first pattern layer and the second pattern layer in the blocking dam may be of an integral structure. That is, the pixel defining layer, the isolation column, the first pattern layer and the second pattern layer may all be formed by patterning one film layer. Therefore, the to manufacturing process of the display substrate may be simplified.

In at least one embodiment of the present disclosure, the blocking dam(s) further include a third pattern layer between the second pattern layer and the substrate. For example, as shown in FIGS. 1B and 10, the blocking dam 200 of the display substrate 1 further includes a third pattern layer 230, and the third pattern layer 230 is located between the substrate 100 and the second pattern layer 220. The third pattern layer 220 may increase a thickness of the blocking dam 200, improve the anti-overflow effect of the blocking dam 200, and increase a contact area between the blocking dam 200 and the first encapsulation layer 310, thereby improving the encapsulation effect of the display substrate 1.

In at least one embodiment of the present disclosure, the display substrate further includes a planarization layer covering at least the active area. The planarization layer and the third pattern layer may be formed by patterning the same film layer. For example, as shown in FIG. 1D, a planarization layer 231 is provided in the active area 101 of the display substrate 1. The third pattern layer 230 and the planarization layer 231 are disposed in the same layer and have the same material. For example, in a process of forming the third pattern layer 230 and the planarization layer 231, a material layer may be deposited first, and then a material layer may be patterned. A portion of the material layer located in the active area 101 is formed into the planarization layer 231, and a portion of the material layer located in the frame area 102 is formed into the third pattern layer 230. In addition, there is a distance between the planarization layer 231 and the third pattern layer 230. In this way, the formation of the third pattern layer 230 does not increase the process steps for manufacturing the display substrate 1, thereby simplifying the production process. In the manufacturing process of the display substrate 1, the planarization layer 231 may be used to provide a planarized surface, so as to improve a film forming quality of structures (e.g., the light emitting device 400, the pixel defining layer 221 and the first encapsulation layer 310 in FIG. 1D) formed over the planarization layer 231, and improve an uniformity of the film layer. For example, a material of the planarization layer 231 may include an organic material, and since the organic material has a relatively small stress and a relatively large flexibility, stress subject to the display substrate 1 may be buffered, which is beneficial to a flexible design of the display substrate 1.

It will be noted that, the term "thickness" described in the embodiments of the present disclosure may be a distance from a surface of a structural layer (e.g., the blocking dam 200 shown in FIGS. 1B to 1D) facing away from the substrate to a surface of the structural layer facing (proximate to) the substrate.

Moreover, in the embodiments of the present disclosure, the number of pattern layers in the blocking dam may be designed as required. For example, the blocking dam may include at least one of the first pattern layer, the second pattern layer and the third pattern layer, and may further include pattern layers formed in other manners, which are not limited herein.

For example, in a case where the blocking dam includes only the first pattern layer, the groove may not extend through the first pattern layer, or the groove may extend through the first pattern layer to be formed into an opening. In a case where the blocking dam includes the first pattern layer and the second pattern layer, the groove may not extend through the first pattern layer (e.g., the groove 20 and the first pattern layer 210 shown in FIG. 1B), or the groove may extend through the first pattern layer and a surface of the second pattern layer facing the first pattern layer serves as the bottom surface of the groove (e.g., the groove 20 and the first pattern layer 210 shown in FIG. 10), or the groove may extend through the first pattern layer and partially extend through the second pattern layer, and in this case, the surface of the second pattern layer facing away from the substrate has a recess; or, the groove may extend through the first pattern layer and the second pattern layer. For a case where the blocking dam includes three or more pattern layers, the analogy is in order.

It will be noted that, the embodiments of the present disclosure do not limit a planar shape of the blocking dam (e.g., a shape of an orthogonal projection of the blocking dam on the substrate). For example, the planar shape of the blocking dam may be a closed ring shape surrounding the active area as shown in FIG. 1A, for example, may be set to be in a shape of a rectangular ring, a circular ring, a nearly circular ring or an ellipse according to a shape of the active area, so that the blocking dam may have an anti-overflow effect in any planar direction. Or the planar shape of the blocking dam may be a ring shape with a notch, which is provided in a region where overflow is not likely to occur, thereby preventing the blocking dam material from bulging when it is thermally expanded, and maintaining a good anti-overflow effect. For example, in some other embodiments of the present disclosure, the planar shape of the blocking dam may be in segments, e.g., straight segments or curved segments. For example, the blocking dam may include at least one sub-blocking dam, e.g., a plurality of sub-blocking dams, and the plurality of sub-blocking dams may be collectively enclosed in a ring shape, or at least one sub-blocking dam may be provided only in a region where overflow is likely to occur. In this way, the blocking dam may be provided in the region of the display substrate where overflow is likely to occur, so as to simplify a structure of the display substrate.

In addition, the planar shape of the blocking dam may not be a straight line shape, and may have a curvature. For example, sides of a rectangular ring may have a slight curvature, or each segment may have a curvature. As long as a good anti-overflow effect may be achieved, the embodiments of the present disclosure are not limited thereto.

It will be noted that, the term "planar shape" described in the embodiments of the present disclosure may be a shape of an orthogonal projection of a structure on a plane where the substrate is located (e.g., a plane defined by X-Y in FIG. 1A), and the phase "planar direction" is parallel to both the X axis and the Y axis.

Hereinafter, a display substrate, a manufacturing method therefor, and a display device in at least one embodiment of the present disclosure will be described by taking an example in which the planar structure of the blocking dam is a closed ring surrounding the active area.

For example, in the display substrate provided by at least one embodiment of the present disclosure, the groove is provided to surround the active area, and an orthogonal projection of the groove on the substrate is in a closed ring shape. For example, as shown in FIG. 1A, the planar shape of the groove 20 is closed around the active area 101, so that the groove 20 may improve the anti-overflow effect of the blocking dam 200 in any planar direction.

It will be noted that, in at least one embodiment of the present disclosure, the number of blocking dams of the display substrate is not limited. For example, in some embodiments of the present disclosure, the at least one blocking dam include one blocking dam 200 as shown in FIGS. 1A to 1D. For example, in some other embodiments of the present disclosure, the at least one blocking dam includes at least to two blocking dams. For example, the at least two blocking dams surround the active area and are sequentially arranged from inside to outside.

Figure 2A:
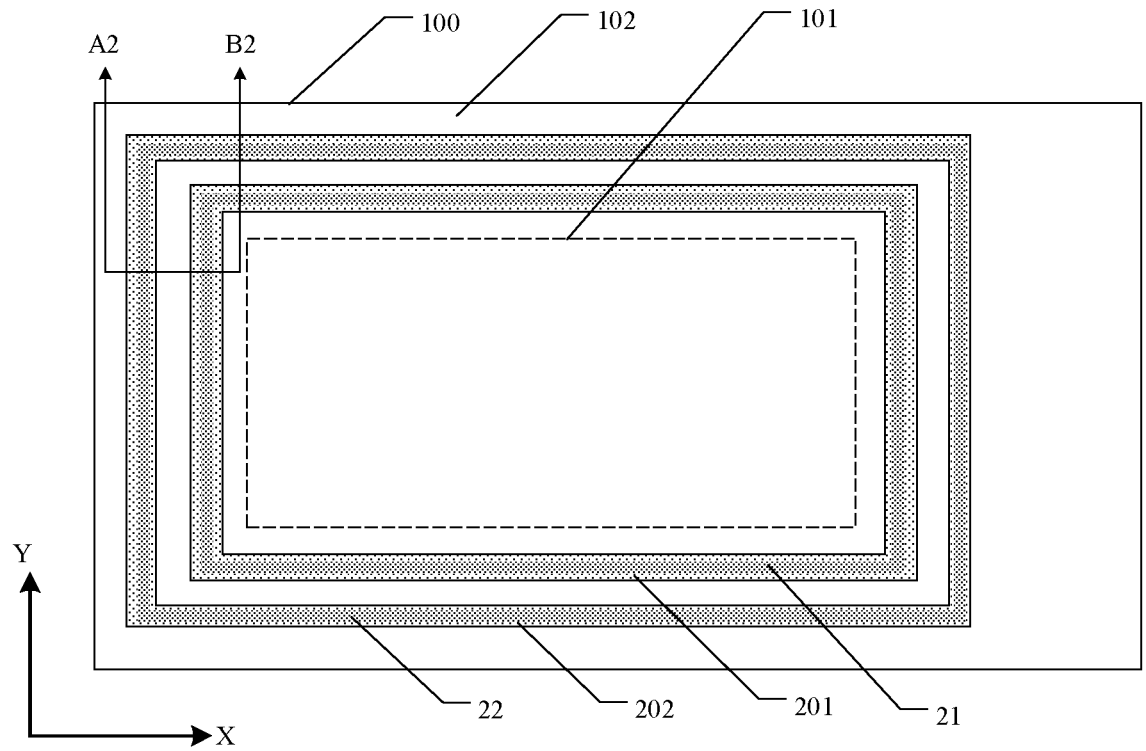
FIG. 2A is another top view of a display substrate, in accordance with some embodiments.
Figure 2B:
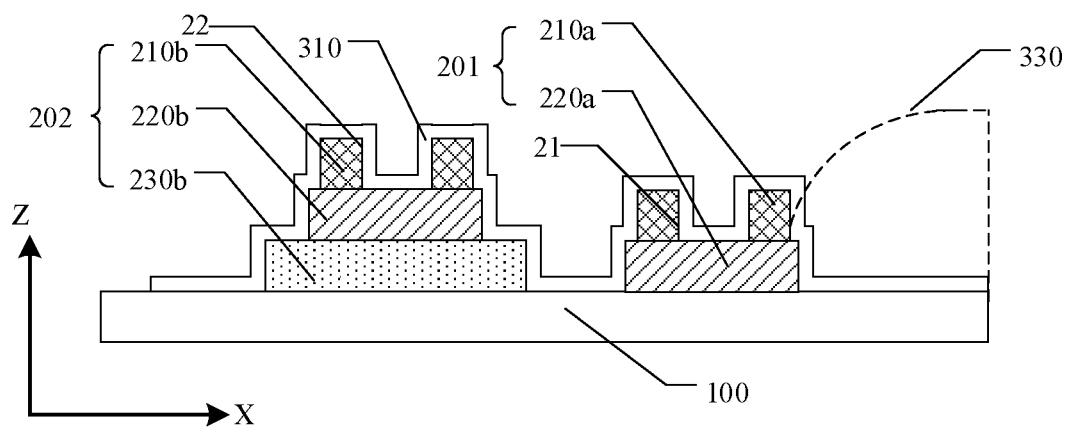
FIG. 2B is a sectional view of the display substrate in FIG. 2A taken along the A2-B2 line.

For example, in the display substrate provided by at least one embodiment of the present disclosure, the at least one blocking dam includes at least two blocking dams. The at least two blocking dams include a first blocking dam and a second blocking dam, and the first blocking dam is located between the active area and the second blocking dam. For example, as shown in FIGS. 2A and 2B, the at least two blocking dams 200 include a first blocking dam 201 and a second blocking dam 202, and the first blocking dam 201 and the second blocking dam 202 surround the active area 101 and are sequentially arranged from inside to outside (i.e., in a direction from a center to an edge of the display substrate 1). The first blocking dam 201 and the second blocking dam 202 may be arranged in concentric rings, and the first blocking dam 201 is located between the second blocking dam 202 and the active area 101. In this case, the at least two blocking dams may reduce a risk of liquid overflow in the process of encapsulating the display substrate, thereby improving an encapsulation yield of the display substrate.

It will be noted that, for a planar shape and an arrangement manner of each blocking dam, refer to the foregoing description, which will not be repeated herein. For example, one blocking dam may be in a closed ring, and the other blocking dam may be in segments; or both blocking dams are in segments, and at least one opening of one blocking dam corresponds to one sub-blocking dam of the other blocking dam; or at least one opening of one blocking dam is at least partially overlapped with at least one opening of the other blocking dam; or one blocking dam is in segments, and the other blocking dam is in a closed ring.

In some embodiments, in a direction from the center to the edge of the display substrate, e.g., a direction from the active area to the frame area, distances from tops (e.g., surfaces facing away from the substrate) of a plurality of (at least two) blocking dams to the substrate increases successively, that is, heights of the plurality of blocking dams increases successively. For example, a height difference between two adjacent blocking dams may be the same or different. In this way, a height of a blocking dam relatively proximate to the active area is relatively small, so that defective structures formed in the active area due to a relatively large height of the blocking dam may be reduced in the manufacturing process (such as an evaporation process or an encapsulation process) of the display substrate.

It will be noted that, in at least one embodiment of the present disclosure, the term "height" may be a distance from a surface of a structure (e.g., the blocking dam) facing away from the substrate to the substrate.

For example, in the display substrate provided by at least one embodiment of the present disclosure, in a case where the first blocking dam and the second blocking dam are provided on the display substrate, and the first blocking dam is located between the active area and the second blocking dam, as shown in FIG. 2B, the first blocking dam 201 may be set as a blocking dam including a first pattern layer 210a and a second pattern layer 220a, and the second blocking dam 202 may be set as a blocking dam including the first pattern layer 210b, the second pattern layer 220b and a third pattern layer 230b. In this way, a height of the second blocking dam 202 farther away from the active area 101 may be greater than a height of the first blocking dam 201 closer to the active area 101.

In the display substrate provided by at least one embodiment of the present disclosure, in the at least one blocking dam provided with the grooves, the grooves are set to at least two grooves and are arranged in sequence from inside to outside around the active area. For example, as shown in FIG. 2A, the blocking dams 200 includes the first blocking dam 201 and the second blocking dam 202. The first blocking dam 201 and the second blocking dam 202 may be arranged in concentric rings, and the first blocking dam 201 is located between the second blocking dam 202 and the active area 101. For example, a first groove 21 surrounding the active area 101 is provided in the first blocking dam 201, and a second groove 22 surrounding the active area 101 is provided in the second blocking dam 202. In this way, a risk of overflow in the process of encapsulating the display substrate may be reduced, thereby improving the encapsulation yield of the display substrate.

Figure 3A:
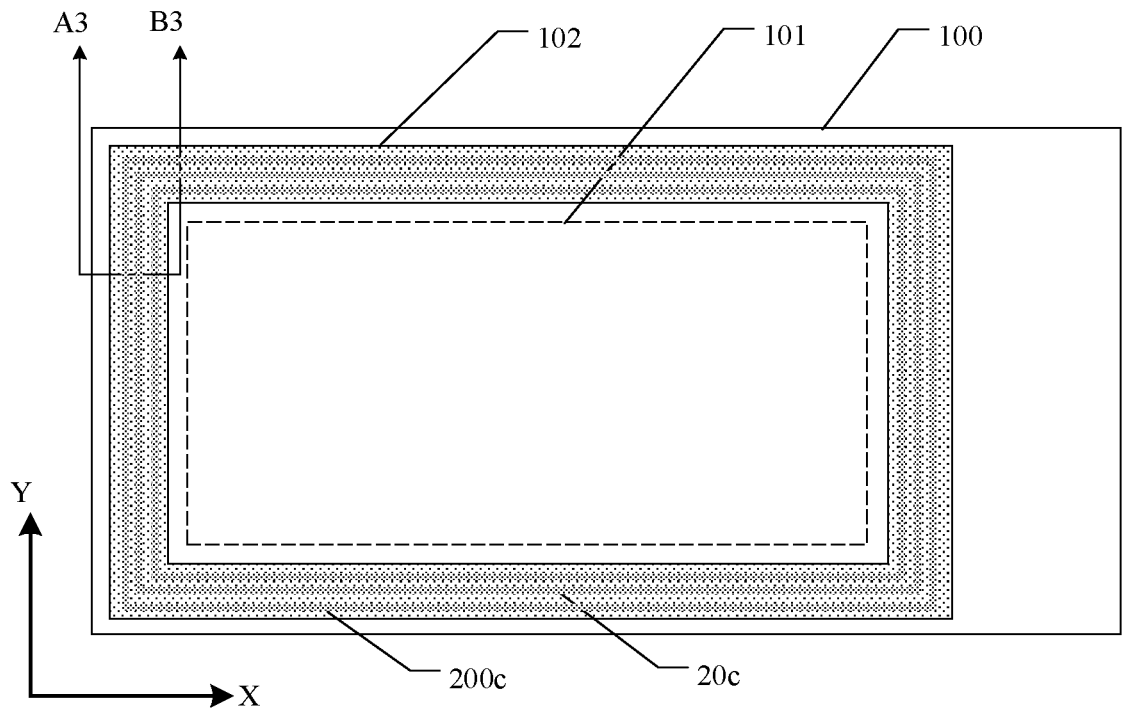
FIG. 3A is yet another top view of a display substrate, in accordance with some embodiments.
Figure 3B:
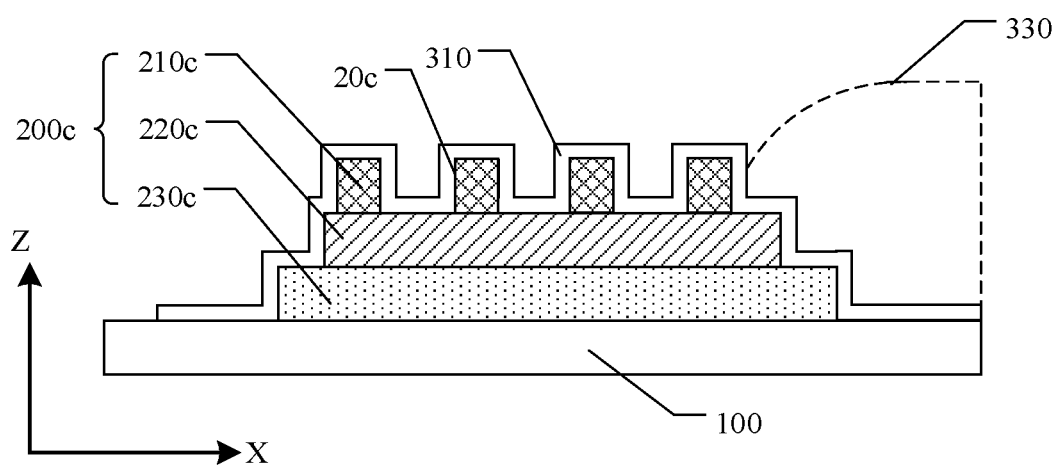
FIG. 3B is a sectional view of the display substrate in FIG. 3A taken along the A3-B3 line.

In the display substrate provided by at least one embodiment of the present disclosure, one or a plurality of grooves may be provided in one blocking dam. For example, in one blocking dam, a plurality of grooves are arranged around the active area, e.g., arranged in concentric rings. For example, as shown in FIGS. 3A and 3B, one blocking dam 200c is provided in the display substrate 1. Three grooves 20c are provided on a surface of the blocking dam 200c facing away from the substrate 100, and the three grooves 20c are arranged in concentric rings. In a process of forming the third encapsulation layer, if a liquid needs to pass over the blocking dam 200c, a boundary of the liquid needs to enter the grooves 20c (recesses to be formed in the first encapsulation layer 310 that is conformal to the grooves 20c) three times. That is, the boundary of the liquid needs to climb four times at portions of the first encapsulation layer 310 that overlaps the blocking dam 200c before it may completely pass over the blocking dam 200c. In this way, for the blocking dam in the embodiments of the present disclosure, the blocking dam 200c with the three grooves 20c may be equivalent to four to original blocking dams (i.e., blocking dams without grooves) in terms of the anti-overflow effect. In this way, the number of blocking dams designed in the display substrate may be reduced, thereby reducing the width of the frame area of the display substrate, which is beneficial to realize a narrow-frame design. For example, only one blocking dam, e.g., the blocking dam 200c, may be provided in the display substrate.

It will be noted that, in at least one embodiment of the present disclosure, a width of the blocking dam may be designed according to the number of grooves provided therein. For example, in the display substrate 1 as shown in FIG. 1B, 1C or 2B, the width of the blocking dam 200 may be set to 20 µm to 80 µm, e.g., 30 µm to 40 µm. For example, in the display substrate 1 as shown in FIG. 3B, the width of the blocking dam 200c may be set to 60 µm to 80 µm.

For example, the groove 20 may be set to be in a closed shape as shown in FIG. 1A surrounding the active area. For example, the groove may be set to be in a shape of a rectangular ring, a circular ring, a nearly circular ring, or an ellipse according to the shape of the active area. The planar shape of the groove may be a ring with a notch, and the notch is disposed in a region where overflow is not likely to occur. For example, in some other embodiments of the present disclosure, the groove may be formed in segments, e.g., straight segments or curved segments. For example, the groove may include at least one sub-groove, e.g., a plurality of sub-grooves, and the plurality of sub-grooves may be collectively enclosed in a ring shape, or at least one sub-groove may be provided only in a region where overflow is likely to occur. That is, no groove is formed in a region where a part of the blocking dam is located.

It will be noted that, in the practical process, process factors are taken into consideration, and in a case where a plurality of blocking dams are provided, a distance to between two adjacent blocking dams is relatively large, and the distance is much larger than the width of the groove(s) formed in a blocking dam. Therefore, the width of the blocking dam 200c as shown in FIG. 3B is much smaller than a total width of four blocking dams provided in the display substrate and gaps therebetween, so as to ensure that the display substrate 1 may prevent overflow and realize a narrow-frame design.

It will be noted that, in the embodiments of the present disclosure, the term "width" is a dimension of a structure (e.g., the blocking dam) in a direction from the active area to the frame area. For example, as shown in FIG. 3B, the width of the blocking dam 200c is a dimension of the blocking dam 200c in a X-axis direction.

For example, the blocking dam 200c may include a third pattern layer 230c, a second pattern layer 220c and a first pattern layer 210c that are sequentially stacked on the substrate 100. For structures of the third pattern layer 230c, the second pattern layer 220c and the first pattern layer 210c, refer to the relevant descriptions of the third pattern layer, the second pattern layer and the first pattern layer in the foregoing embodiments, which will not be repeated herein.

Figure 4A:
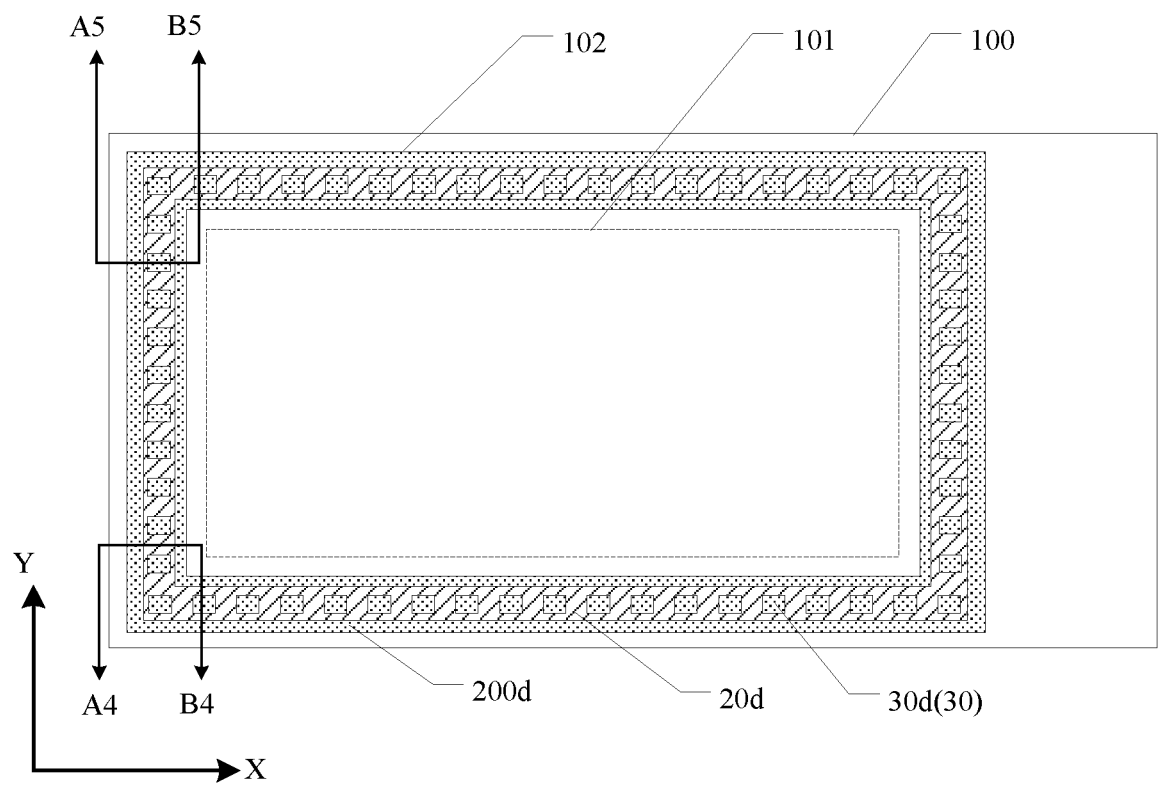
FIG. 4A is yet another top view of a display substrate, in accordance with some embodiments.
Figure 4B:
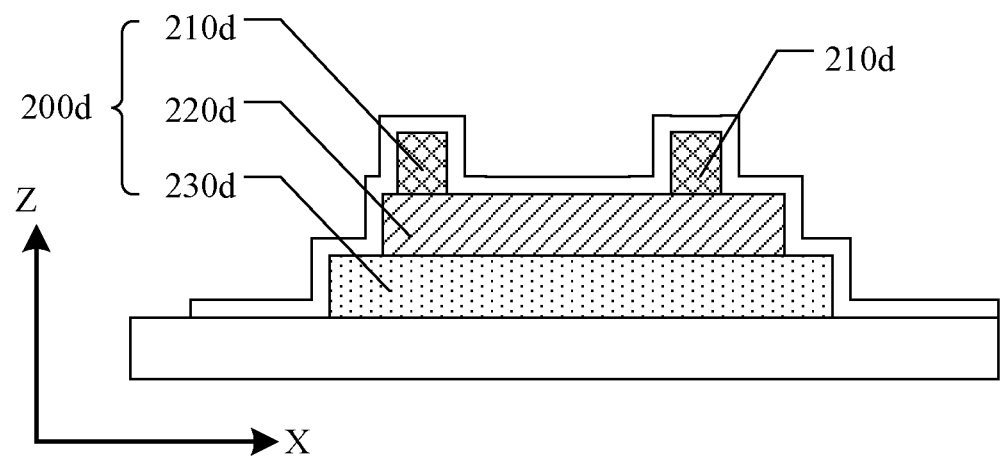
FIG. 4B is a sectional view of the display substrate in FIG. 4A taken along the A4-B4 line.
Figure 4C:
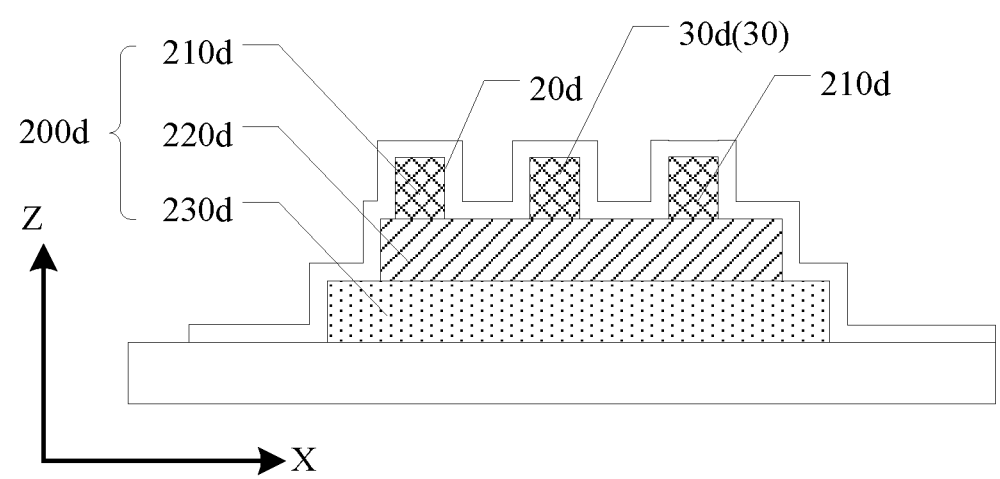
FIG. 4C is a sectional view of the display substrate in FIG. 4A taken along the A5-B5 line.

For example, in the display substrate provided by at least one embodiment of the present disclosure, a plurality of protruding portions are provided in the groove, and the plurality of protruding portions are sequentially arranged at intervals in an extending direction of the groove. For example, as shown in FIGS. 4A, 4B and 4C, a plurality of protruding portions 30 (indicated by 30d in FIGS. 4A and 4C) spaced apart from each other are provided in the groove 20d of the blocking dam 200d. The protruding portions 30 may be equivalent to wave-absorbing blocks. That is, in the process of forming the third encapsulation layer, if the liquid overflows into the groove 20d, a kinetic energy of overflow of the liquid will be weakened due to an effect of the protruding portions 30, so that it is difficult to overflow from the groove 20d again. For example, in at least one embodiment of the present disclosure, as shown in FIG. 4A, the plurality of protruding portions 30 are sequentially arranged in an extending direction of the groove 20d. That is, in a case where the planar shape of the groove 20d is a ring shape, the plurality of protruding portions 30 may surround the active area 101. That is, a connecting line sequentially connecting the plurality of protruding portions 30 surrounds the active area 101. In this way, the risk of overflow in the process of encapsulating the display substrate may be reduced, thereby improving the encapsulation yield of the display substrate.

Figure 4D:
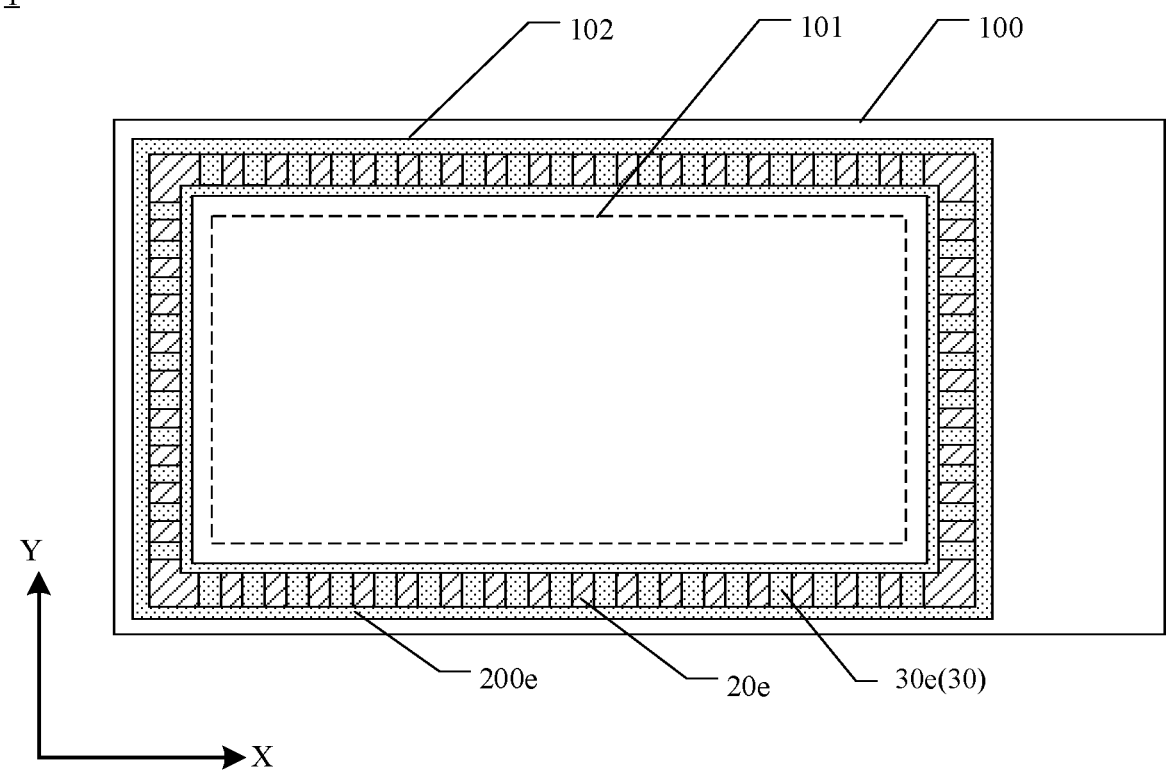
FIG. 4D is yet another top view of a display substrate, in accordance with some embodiments.

For example, as shown in FIG. 4D, the protruding portion 30 (indicated by 30e in FIG. 4D) may be in contact with sidewalls of the groove 20e on one side thereof (e.g., a side face of the protruding portion 30 in a width direction of the groove 20e) without a gap. In this case, the protruding portions 30 and the groove 20e may be of an integral structure. In terms of process, the protruding portions 30 and the groove 20e may be formed by patterning the same film layer. The protruding portions 30 and the groove 20 are an integrated structure.

For example, in the display substrate provided by some embodiments of the present disclosure, the plurality of protruding portions and a portion of the blocking dam facing away from the substrate are configured to be formed by patterning the same film layer. For example, as shown in FIG. 4C, the blocking dam 200d includes a third pattern layer 230d, a second pattern layer 220d and a first pattern layer 210d that are sequentially stacked on the substrate 100. The groove 20d is formed in the first pattern layer 210d. For example, in a process of patterning a material layer to form the first pattern layer 210d, the protruding portions 30 may be formed simultaneously. In this way, a manufacturing process of the blocking dam 200d may be simplified, and the cost may be reduced. For example, for structures of the first pattern layer 210d, the second pattern layer 220d and the third pattern layer 230d, refer to the relevant descriptions of the first pattern layer, the second pattern layer and the third pattern layer in the foregoing embodiments, which will not be repeated herein.

For example, in some other embodiments of the present disclosure, the protruding portions 30 as shown in FIG. 4C may also be separately formed through an additional process. For example, after the blocking dam 200d with the groove 20d is formed, a material layer is deposited in the groove 20d, and the material layer is patterned to form the protruding portions 30.

For example, in the display substrate provided by at least one embodiment of the present disclosure, a shape of an orthogonal projection of the protruding portions on the substrate is at least one of a triangle, a rectangle, a polygon and a circle, and may also be other shapes. For example, as shown in FIG. 4A, the shape (i.e., the planar shape) of the orthogonal projection of the protruding portions 30 on the substrate 100 is a rectangle.

Figure 5:
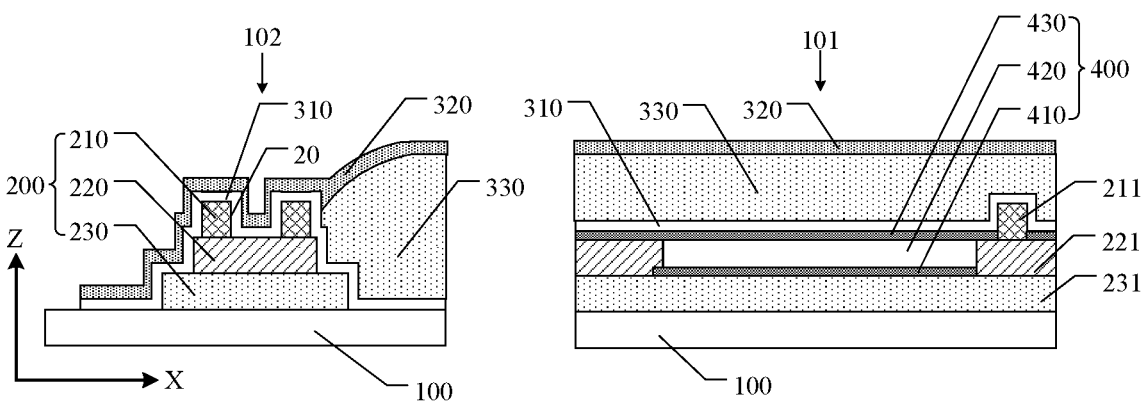
FIG. 5 is yet another structural diagram of a display substrate, in accordance with some embodiments.

For example, the display substrate provided by at least one embodiment of the present disclosure further includes a second encapsulation layer and a third encapsulation layer. The second encapsulation layer is located above a side of the first encapsulation layer away from the substrate, and the third encapsulation layer is located between the first encapsulation layer and the second encapsulation layer. The second encapsulation layer covers the active area and the blocking dam(s), and the third encapsulation layer covers at least the active area. An edge of an orthogonal projection of the blocking dam(s) on the substrate away from the active area is located outside an orthogonal projection of the third encapsulation layer on the substrate. For example, FIG. 5 may be a sectional view of partial areas of the display panel shown in FIG. 1A after completion of encapsulation. As shown in FIG. 5, after the first encapsulation layer 310 is formed, the third encapsulation layer 330 is formed on the substrate 100 of the display substrate 1. Due to the blocking of the blocking dam 200, a region of the third encapsulation layer 330 is defined by the blocking dam 200. An edge of the orthogonal projection of the third encapsulation layer 330 on the substrate 100 is located within a range of an orthogonal projection of the blocking dam 200 on the substrate 100.

In this case, in a process of forming the third encapsulation layer 330, there may be a phenomenon in a partial region that the liquid overflows into a recess of the first encapsulation layer 310 corresponding to the groove 20, but the liquid does not overflow from the recess. That is, in the region, sidewalls of the groove 20 (or the recess of the first encapsulation layer 310) facing away from the active area 101 may define a position of the third encapsulation layer 330, and in this case, an edge of the third encapsulation layer 330 is located in the groove 20. In addition, the second encapsulation layer 320 covers the third encapsulation layer 330, for example, the second encapsulation layer 320 further covers the first encapsulation layer 310.

It will be noted that, in the embodiments of the present disclosure, specific materials of the first encapsulation layer, the second encapsulation layer and the third encapsulation layer are not limited. For example, a material of the first encapsulation layer and a material of the second encapsulation layer may include an inorganic material, that is, both the first encapsulation layer and the second encapsulation layer are inorganic encapsulation layers. The inorganic material may be, for example, silicon nitride, silicon oxide or silicon oxynitride. The first inorganic encapsulation layer and the second inorganic encapsulation layer formed of the inorganic material have high density, which may prevent intrusion of moisture, oxygen and the like. For example, a material of the third encapsulation layer may include an organic material, that is, the third encapsulation layer is an organic encapsulation layer. The organic material may be a polymer material containing a desiccant or a polymer material that may block moisture, e.g., a polymer resin, so as to planarize the surface of the display substrate and relieve the stress of the first encapsulation layer and the second encapsulation layer. For example, the material of the third encapsulation layer may also include a water-absorbent material. The water-absorbent material may be alkali metals (e.g., lithium (Li) and sodium (Na)), alkaline earth metals (e.g., barium (Ba) and calcium (Ca)) or other moisture-reactive metals (e.g., aluminum (Al) and iron (Fe)). The water-absorbent material may also be alkali metal oxides (e.g., lithium oxide ($Li_2O$) and sodium oxide ($Na_2O$)), alkaline earth metal oxides (e.g., magnesium oxide (MgO), calcium oxide (CaO) and barium oxide (BaO)), sulfates (e.g., anhydrous magnesium sulfate ($MgSO_4$)), metal halides (e.g., calcium chloride ($CaCl_2$)) or perchlorates (e.g., magnesium perchlorate $Mg(ClO_4)_2$)), etc., so as to absorb substances such as moisture and oxygen that have intruded into the interior of the third encapsulation layer.

For example, the display substrate provided by at least one embodiment of the present disclosure further includes a plurality of light-emitting devices arranged in an array in the active area. The light-emitting devices are located between the first encapsulation layer and the substrate. For example, as shown in FIG. 5, the pixel defining layer 221 defines a region where the light-emitting device 400 is located. The light-emitting device 400 includes a first electrode 410, a light-emitting functional layer 420 and a second electrode 420 that are sequentially stacked on the planarization layer 231, and the light-emitting functional layer 420 is located in an opening of the pixel defining layer 221.

In the embodiments of the present disclosure, materials of the first electrode and the second electrode in the light-emitting devices are not limited. For example, one of the first electrode and the second electrode may be an anode, and the other may be a cathode. The anode may be formed of, for example, a transparent conductive material with a high work function, and an electrode material thereof may include indium tin oxide (ITO), indium zinc oxide (IZO), indium gallium oxide (IGO), gallium zinc oxide (GZO), zinc oxide (ZnO), indium oxide (In$_2$O$_3$), aluminum zinc oxide (AZO), carbon nanotubes, or the like. The cathode may be formed of, for example, a material with high conductivity and low work function, and an electrode material thereof may include alloys such as magnesium aluminum alloy (MgAl) or lithium aluminum alloy (LiAl), or simple metals such as magnesium, aluminum, lithium or silver (Ag).

For example, in at least one embodiment of the present disclosure, the light-emitting functional layer includes a light-emitting layer. The light-emitting functional layer may further include structures such as a hole injection layer and a hole transport layer between the anode and the light-emitting layer, and an electron transport layer and an electron injection layer between the cathode and the light-emitting layer. The light-emitting functional layer may further include a hole blocking layer and an electron blocking layer. The hole blocking layer may be provided, for example, between the electron transport layer and the light-emitting layer, and the electron blocking layer may be provided, for example, between the hole transport layer and the light-emitting layer.

For example, in at least one embodiment of the present disclosure, a material of the light-emitting layer may be selected according to a color of light emitted therefrom. For example, the material of the light-emitting layer includes a fluorescent light-emitting material or a phosphorescent light-emitting material. For example, in at least one embodiment of the present disclosure, the light-emitting layer may adopt a doping system, that is, a dopant material is mixed into a host light-emitting material to obtain a usable light-emitting material. For example, the host luminescent material may be a metal compound material, a derivative of anthracene, an aromatic diamine compound, a is triphenylamine compound, an aromatic triamine compound, a benzidine diamine derivative, a triarylamine polymer, or the like.

For example, in at least one embodiment of the present disclosure, the substrate may include a plurality of functional layers. For example, the substrate may include a base substrate and a driving circuit layer disposed on the base substrate. For example, the driving circuit layer may include pixel driving circuits including a plurality of transistors, capacitor(s) and a light-emitting device, which are formed into various forms such as 2T1C (i.e., two transistors (T) and one capacitor (C)), 3T1C or 7T1C. The embodiments of the present disclosure do not limit a structure and composition of the driving circuit layer. The pixel driving circuits may be located in the active area, and between the planarization layer and the base substrate. A via hole may be provided in the planarization layer, so that the first electrode of the light-emitting device may be coupled to a drain or a source of a transistor.

Figure 6A:
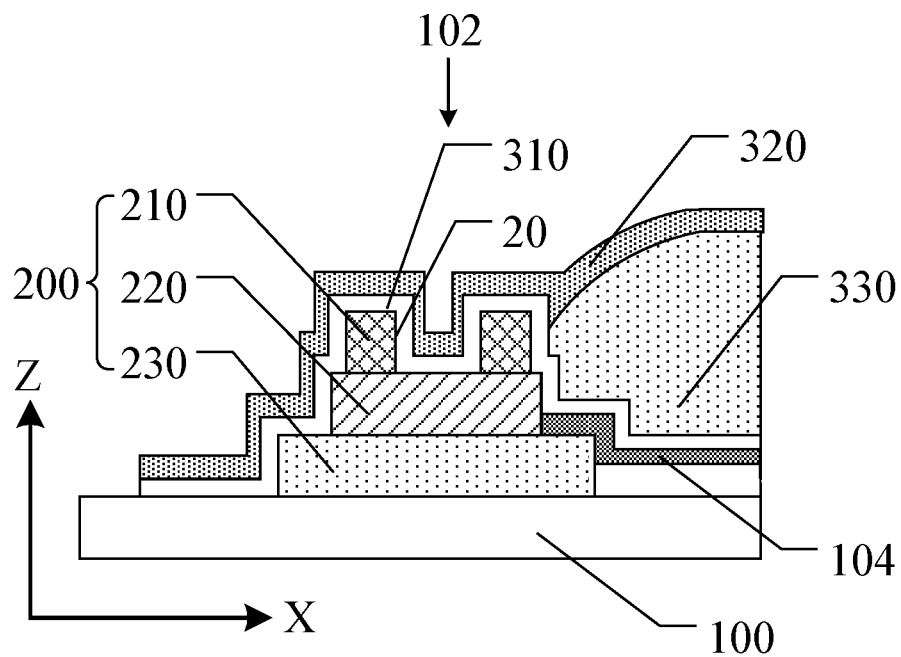
FIG. 6A is yet another structural diagram of a display substrate, in accordance with some embodiments.
Figure 6B:
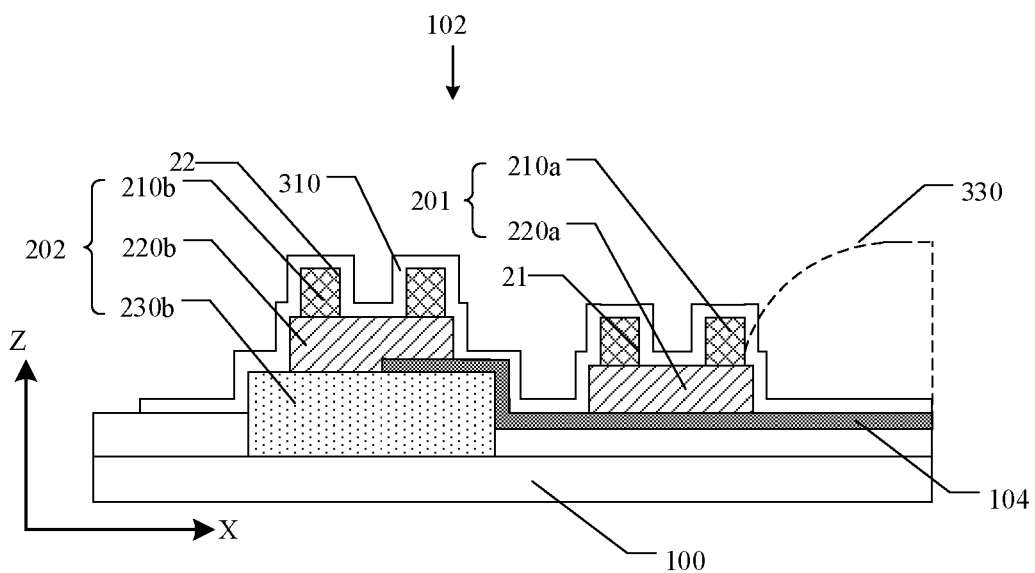
FIG. 6B is yet another structural diagram of a display substrate, in accordance with some embodiments.

For example, as shown in FIGS. 6A and 6B, the display substrate 1 further includes a conductive pattern 104 located in the frame area 102. The conductive pattern 104 and the first electrode 410 of the light-emitting device 400 are disposed in the same layer and have the same material. That is, the conductive pattern 104 and the first electrode 410 may be formed synchronously. For example, the conductive pattern may serve as component s such as signal lines or contact pads. For example, an edge of an orthogonal projection of the conductive pattern 104 on the substrate 100 away from the active area 101 is located within a range of an orthogonal projection of the blocking dam 200 on the substrate 100. For example, as shown in FIG. 6A, an orthogonal projection of the conductive pattern 104 on the substrate 100 is overlapped with an orthogonal projection of the third pattern layer 230 on the substrate 100, and is not overlapped with orthogonal projections of the second pattern layer 220 and the first pattern layer 210 on the substrate 100. Or, as shown in FIG. 6B, the orthogonal projection of the conductive pattern 104 on the substrate 100 is overlapped with orthogonal projections of the third pattern layer 230b, the second pattern layer 220b and the first pattern layer 210b on the substrate 100, and a portion of the conductive pattern 104 is located between the third pattern layer 230 and the second pattern layer 220. For example, as shown in FIG. 6B, the conductive pattern 104 is located on a side of the first blocking dam 201 proximate to the substrate 100, and the conductive pattern 104 is extended between the second pattern layer 220b and the third pattern layer 230b in the second blocking dam 202.

Figure 7:
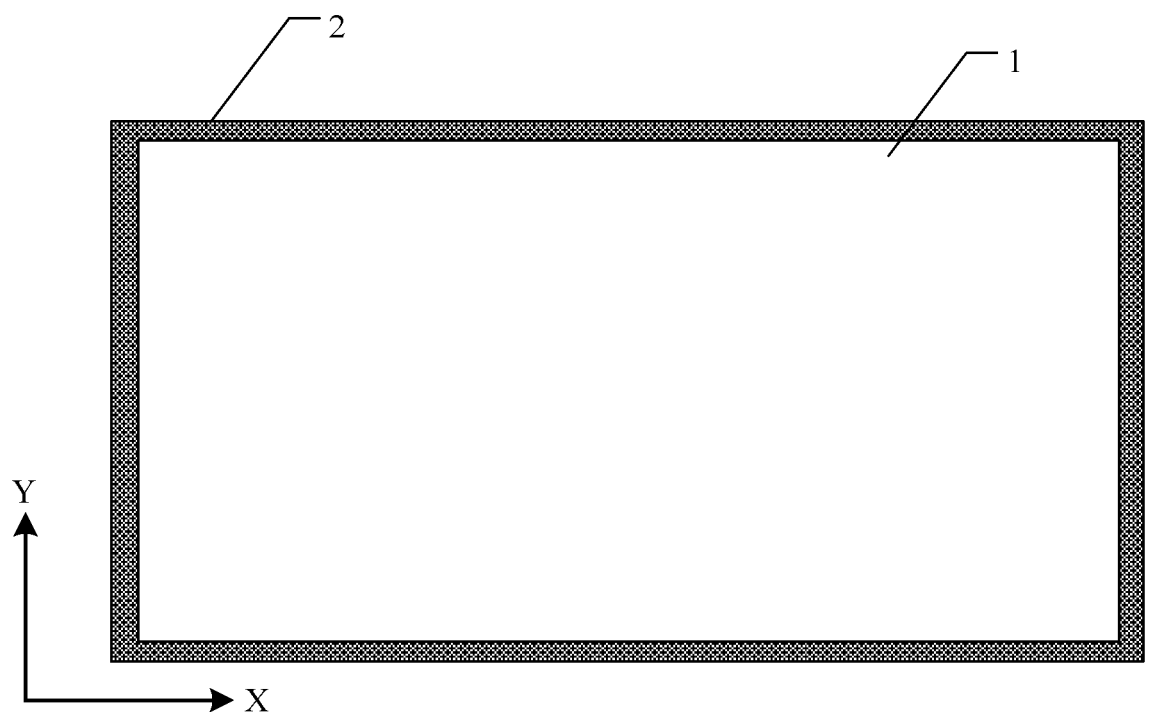
FIG. 7 is a structural diagram of a display device, in accordance with some embodiments.

At least one embodiment of the present disclosure provides a display device including the display substrate in any one of the above embodiments. For example, as shown in FIG. 7, the display device 3 further includes an outer frame 2 disposed around the display substrate 1. For example, in the display device provided by at least one embodiment of the present disclosure, a touch structure may be provided on a display side of the display substrate to obtain a touch function.

For example, the display device may be any device that displays images whether moving (e.g., videos) or stationary (e.g., still images), and whether textual or graphical. More specifically, it is contemplated that the embodiments may be implemented in or associated with a variety of electronic devices, such as (but not limit to) mobile telephones, wireless devices, personal data assistants (PDAs), hand-held or portable computers, global positioning system (GPS) receivers/navigators, cameras, MPEG-4 portion 14 (MP4) video players, video cameras, game consoles, watches, clocks, calculators, TV monitors, flat-panel displays, computer monitors, vehicle displays (e.g., odometer displays), navigators, cockpit controllers and/or displays, camera view displays (e.g., rear view camera displays in a vehicle), electronic photos, electronic billboards or signs, projectors, building structures, and packagings and aesthetic structures (e.g., displays of images of a piece of jewelry).

It will be noted that, not all structures of the display panel are described for clarity. In order to realize necessary functions of the display panel, those skilled in the art may set other structures according to specific application scenarios, and the present disclosure are not limited thereto. The display device has the same beneficial effects as the display substrate described above, and details are not described herein again.

At least one embodiment of the present disclosure provides a manufacturing method for a display substrate. The method includes following steps. A substrate including an active area and a frame area located around the active area is provided. At least one blocking dam is formed on the substrate and in the frame area, for example, the blocking dam(s) surrounding the active area. At least one groove is formed on a surface of the at least one blocking dam facing away from the substrate. A depth direction of the at least one groove is perpendicular to the substrate, and an extending direction of the at least one groove is substantially the same as an extending direction of the blocking dam provided with the at least one groove. And a first encapsulation layer is formed on the substrate to cover the active area and the at least one blocking dam. For example, a portion of the first encapsulation layer that an orthogonal projection thereof on the substrate overlaps an orthogonal projection of the blocking dam(s) is conformal to a surface of the blocking dam(s) away from the substrate. In the display substrate obtained by this method, the groove(s) may increase a contact area between the blocking dam(s) and the first encapsulation layer, thereby improving a bonding strength of the blocking dam(s) and the first encapsulation layer, prolonging paths of crack propagation, moisture and oxygen intrusion, etc., and improving an encapsulation effect of the first encapsulation layer on the display substrate. In addition, in a subsequent encapsulation process of the display substrate, the groove(s) may increase a difficulty for the liquid to pass over the blocking dam(s), thereby improving an anti-overflow effect of the blocking dam(s). That is, compared with an original blocking dam not formed with the groove(s), the blocking dam formed with the at least one groove may be equivalent to at least two original blocking dams (i.e., blocking dams not formed with the groove(s)) in terms of the anti-overflow effect. In this way, the number of blocking dams designed in the display substrate may be reduced, thereby reducing a width of the frame area of the display substrate, which is beneficial for the display substrate to achieve a narrow-frame design; or, the encapsulation effect of the entire display substrate may be improved without changing the number of blocking dams designed.

For example, in the manufacturing method for a display substrate provided by at least one embodiment of the present disclosure, the at least one blocking dam includes a second pattern layer and a first pattern layer that are sequentially stacked on the substrate, and the groove(s) are formed in the first pattern layer. Forming at least one blocking dam includes following steps. a first material layer is formed on the substrate, and the first material layer is patterned by using a halftone mask. A portion of the patterned first material layer in the active area is formed into an isolation column, a remaining portion of the patterned first material layer in the active area is formed into a pixel defining layer, and the portion formed into the isolation column is farther away from the substrate than the portion formed into the pixel defining layer. A portion of the first material layer in the frame area is formed into a first pattern layer, a remaining portion of the first material layer in the frame area is formed into a second pattern layer, and the portion formed into the second pattern layer is farther away from the substrate than the portion formed into the first pattern layer. In this way, the pixel defining layer, the isolation column, and the first pattern layer and the second pattern layer of the blocking dam(s) may all be formed by one first material layer through a single patterning process, which simplifies the manufacturing process of the display substrate.

For example, in a case where the first material layer is formed into the first pattern layer, the second pattern layer, the pixel defining layer and the isolation column, a width of the pixel defining layer is greater than a width of the isolation column. In the forming process, photoresist may be coated on a surface of the first material layer facing away from the substrate, and then the photoresist is exposed by using a halftone mask and is developed to form photoresist all-removed regions, photoresist semi-reserved regions and a photoresist all-reserved region. The first material layer is etched to remove portions of the first material layer located in the photoresist all-removed regions, that is, a portion of the first material layer located in a photoresist all-removed region in the active area is etched by an entire thickness thereof to form the pixel defining layer, and another portion of the first material layer located in another photoresist all-removed region in the frame area is etched by an entire thickness thereof to form a portion with the largest width of the blocking dam. Then an ashing process is used to remove portions of the photoresist in the photoresist semi-reserved regions. Afterwards, portions of the first material layer located in the photoresist semi-reserved regions are etched to form the first pattern layer and the isolation column. That is, a portion of the first material layer located in a photoresist semi-reserved region is etched by a predetermined thickness (e.g., the predetermined thickness is less than a thickness of the first material layer) to obtain the first pattern layer, for example, the predetermined thicknesses is a thickness of the first pattern layer; and another portion of the first material layer located in another photoresist semi-reserved region is etched by a predetermined thicknesses (e.g., the predetermined thickness is less than a thickness of the first material layer) to obtain the isolation column, for example, the predetermined thickness is a thickness of the isolation columns. Then remaining photoresist in the photoresist all-reserved region is stripped. A portion with the largest width of the first material layer in the frame area that is not continuously etched after the ashing process is formed into the second pattern layer. A portion of the first material layer in the active area that is not continuously etched after the ashing process is formed into the pixel defining layer.

For example, in the manufacturing method for the display substrate provided by at least one embodiment of the present disclosure, the at least one blocking dam includes a second pattern layer and a first pattern layer that are sequentially stacked on the substrate, and the groove(s) are formed in the first pattern layer. Forming at least one blocking dam includes following steps. a second material layer and a first material layer are sequentially deposited on the substrate to form stacked layers; and the first material layer and the second material layer is simultaneously patterned by using a halftone mask. A portion of the first material layer located in the active area is formed into an isolation column, and a portion of the first material layer located in the frame area is formed into the first pattern layer. A portion of the second material layer located in the active area is formed into a pixel defining layer, and a portion of the second material layer located in the frame area is formed into the second pattern layer. In this way, the pixel defining layer, the isolation column and at least portion of the blocking dam(s) may be formed simultaneously, and the isolation column and the first pattern layer and the second pattern layer of the blocking dam may be formed simultaneously, which simplifies the manufacturing process of the display substrate.

For example, in the manufacturing method for the display substrate provided by at least one embodiment of the present disclosure, the at least one blocking dam further includes a third pattern layer between the second pattern layer and the substrate. Forming at least one blocking dam includes following steps. an insulating material film is deposited on the substrate to planarize a surface of the substrate, and a patterning process is performed on the insulating material film. A portion of the insulating material film located in the active area is formed into a planarization layer, and a portion of the insulating material film located in the frame area is formed into a third pattern layer. In this way, the formation of the third pattern layer does not increase process steps for manufacturing the display substrate.

For example, the manufacturing method for a display substrate provided by at least one embodiment of the present disclosure further includes: after forming the first encapsulation layer, coating a liquid including an organic material on an area of the at least one blocking dam towards the active area, and drying and solidifying the liquid to form a third encapsulation layer. The at least one blocking dam and the groove(s) therein are used to define a region where the liquid is located and prevent the liquid from overflowing. In this way, after the liquid is dried, a surface of the third encapsulation layer facing away from the substrate is relatively smooth, so that the third encapsulation layer may have a planarizing effect.

For example, in the manufacturing method for the display substrate provided by at least one embodiment of the present disclosure, a method of coating the liquid includes ink jet printing (IJP) or other methods.

In an example of the embodiments of the present disclosure, the display substrate 1 as shown in FIG. 5 is manufactured, and the manufacturing method for the display substrate 1 may include processes shown in FIGS. 8A to 8I, which are specifically as follows.

Figure 8A:
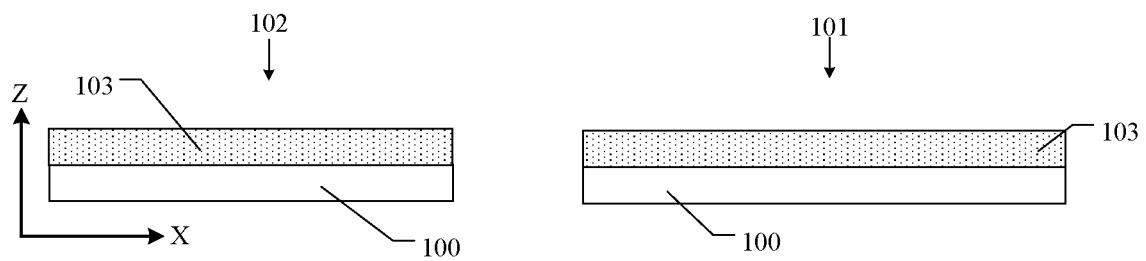
FIGS. 8A to 8I are process diagrams of a manufacturing method for a display substrate, in accordance with some embodiments.

As shown in FIG. 8A, a substrate 100 is provided, an insulating material film 103 with a planarization function is deposited on the substrate 100, and the insulating material film 103 is patterned. A portion of the insulating material film 103 located in the active area 101 is formed into a planarization layer 231, and a portion of the insulating material film 103 located in the frame area 102 is formed into a third pattern layer 230.

For example, in at least one embodiment in the present disclosure, a material of the planarization layer may be an organic material, such as epoxy resin, polyimide, polyamide, acrylic or other suitable materials. In the embodiment shown in FIG. 8B, a material of the third pattern layer 230 is the same as the material of the planarization layer.

For example, the substrate may include a base substrate and a driving circuit layer disposed on the base substrate. For example, the base substrate may be a glass plate, a quartz plate, a metal plate or a resin plate. For example, a material of the base substrate may include an organic material including resin materials such as polyimide, polycarbonate, polyacrylate, polyetherimide, polyethersulfone, polyethylene terephthalate, and polyethylene naphthalate. For example, the substrate may be formed of a plurality of material layers. For example, the substrate may include a base substrate, a material of the base substrate may be composed of the above materials, and a buffer layer may be formed on the surface of the base substrate as a transition layer, which may prevent harmful substances in the base substrate from intruding into the interior of the display substrate, but also may increase an adhesive force of film layers in the display substrate on the base substrate. For example, a material of the buffer layer may include silicon oxide, silicon nitride or silicon oxynitride.

For example, the substrate may include a base substrate and a driving circuit layer disposed on the base substrate. A method of forming the driving circuit layer on the base substrate is related to the type of the transistors. For example, the transistors may be top-gate thin film transistors, bottom-gate thin film transistors, double-gate thin film transistors or other types of thin film transistors. For a process of forming the driving circuit layer on the base substrate, refer to a conventional process, which will not be repeated herein.

Figure 8B:
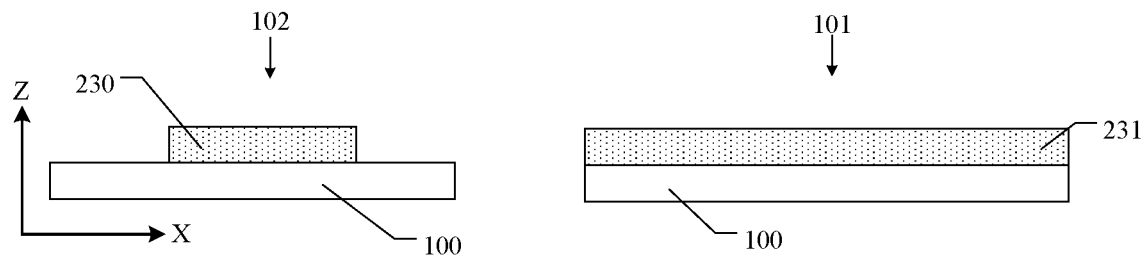
Figure 8C:
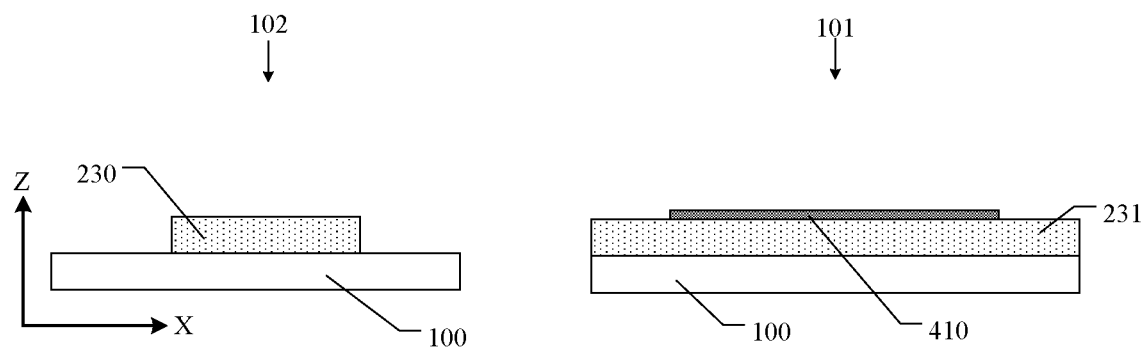

As shown in FIGS. 8B and 8C, a conductive material layer is deposited on the planarization layer 231, and the conductive material layer is patterned to form a first electrode 410. For example, there are a plurality of first electrodes 410 that are spaced apart from each other (only one is shown in FIG. 8C). For a material of the first electrode 410, refer to the relevant descriptions in the foregoing embodiments, which will not be repeated herein.

It will be noted that, the conductive material layer may be further deposited in the frame area when the conductive material layer is deposited, a portion of the conductive material layer located in the frame area may form a conductive pattern in a process of patterning the conductive material layer to form the first electrode, and the conductive pattern is used to form signal lines, contact pads and other components. In this case, the conductive pattern 104 as shown in FIG. 6A may be obtained in the frame area.

Figure 8D:
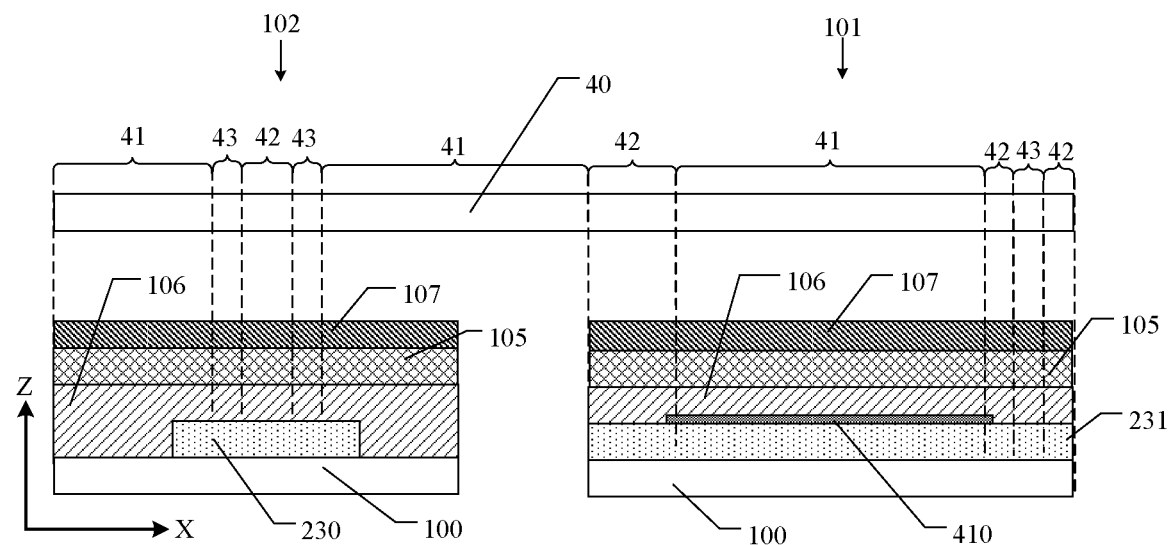

As shown in FIGS. 8C and 8D, the second material layer 106 and the first material layer 105 are sequentially deposited on the substrate 100. For example, the second material layer 106 and the first material layer 105 may both be a photosensitive resin material, such as photoresist 107. For example, the photosensitive resin material is a positive photoresist. Then a halftone mask 40 is provided to expose the second material layer 106 and the first material layer 105.

For example, the halftone mask 40 includes a first area 41, a second area 42 and a third area 43. Light transmittances of the first region 41, the second region 42 and the third region 43 is sequentially reduced. For example, the first regions 41 may be set as openings, and for example, the third regions 43 may be set to be non-light-transmitting. In this way, by designing the light transmittances of the first regions 41, the second regions 42 and the third regions 43 and controlling an exposure intensity in an exposure process, portions of the first material layer 105 and the second material layer 106 corresponding to the first regions 41 are completely exposed, portions of the first material layer 105 corresponding to the second region 42 are completely exposed, and portions of the first material layer 105 and the second material layer 106 corresponding to the third region 43 are not exposed.

It will be noted that, in the practical process, a halftone mask is used for patterning, so that an edge angle of the obtained pattern is small, and film stress due to a height difference may be relieved. In this way, it is beneficial to reduce a distance for encapsulating an edge (frame area) of the display substrate (a distance between an edge of the encapsulation layer and the edge of the display substrate), which is beneficial to a narrow-frame design of the display substrate.

Figure 8E:
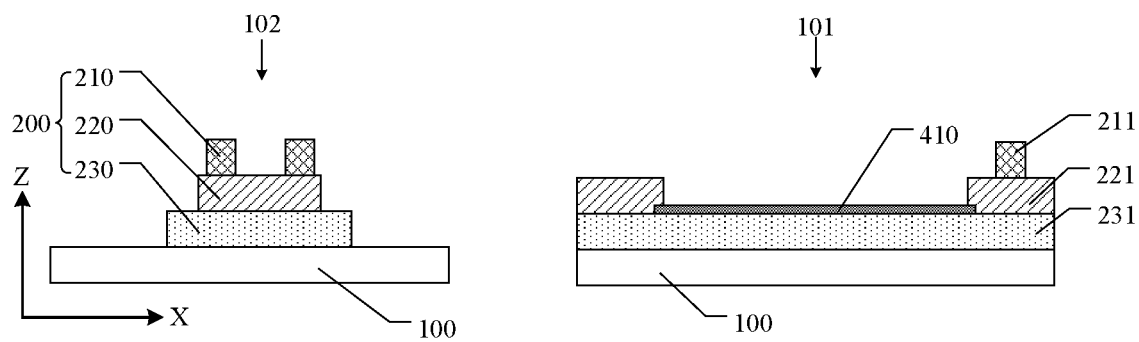

As shown in FIGS. 8D to 8E, after exposing and developing the first material layer 105 and the second material layer 106, a portion of the second material layer 106 located in the active area 101 is formed into the pixel defining layer 221, an opening is formed in the pixel defining layer 221 to expose the first electrode 410, and a portion of the second material layer 106 located in the frame area 102 is formed into the second pattern layer 220. A portion of the first material layer 105 located in the active area 101 is formed into the isolation column 211, and a portion of the first material layer 105 located in the frame area 102 is formed into the first pattern layer 210.

It will be noted that, in the embodiments of the present disclosure, materials of the first material layer and the second material layer may be set to be the same. In this way, a film layer may be deposited on the substrate to be equivalent to the first material layer 105 and the second material layer 106 in FIG. 8D. For example, a thickness of the first material layer (or the second material layer) may be increased, so that the first material layer (or the second material layer) is equivalent to the first material layer 105 and the second material layer 106 shown in FIG. 8D in thickness, and thus the second material layer 106 (or the first material layer 105) does not need to be deposited. Then the thickened first material layer (or the thickened second material layer) is patterned by using the halftone mask. By controlling the exposure intensity, the first pattern layer 210, the second pattern layer 220, the isolation column 211 and the pixel defining layer 221 as shown in FIG. 8E may also be formed. In this way, a process of manufacturing the display substrate may be simplified. In addition, in this case, the first pattern layer 210 and the second pattern layer 220 are an integrated structure, that is, there is no physical interface between the first pattern layer 210 and the second pattern layer 220. The isolation column 211 and the pixel defining layer 221 are an integrated structure, that is, there is no physical interface between the isolation column 211 and the pixel defining layer 221.

Figure 8F:
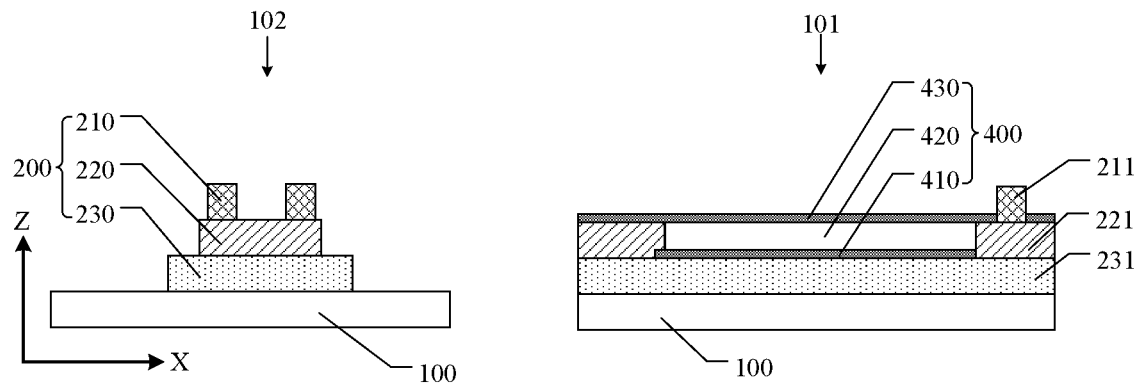

As shown in FIGS. 8E to 8F, a light-emitting functional layer 420 and a second electrode 430 are sequentially formed by using processes such as ink jet printing and evaporation. The first electrode 410, the light-emitting functional layer 420 and the second electrode 430 that are sequentially stacked on the substrate 100 constitute the light-emitting device 400.

Figure 8G:
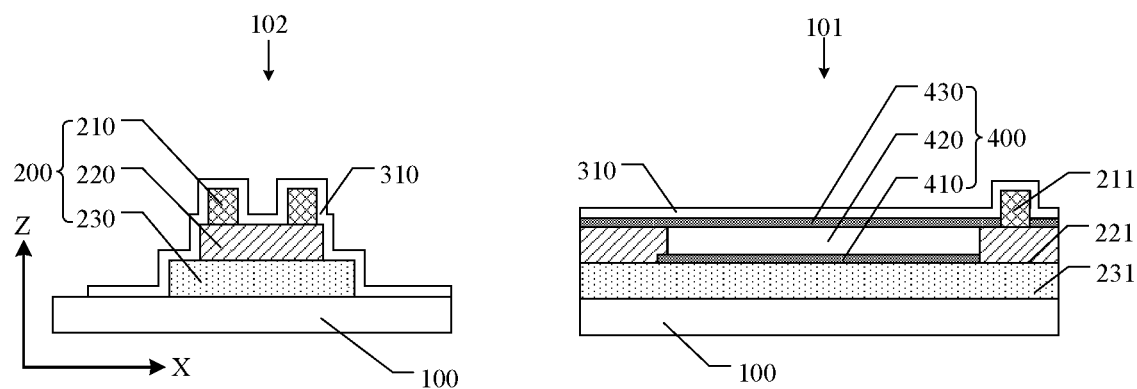

As shown in FIGS. 8F to 8G, an inorganic material is deposited on the substrate 100 to form a first encapsulation layer 310, and the first encapsulation layer 310 covers the active area 101 and covers the blocking dam 200 in the frame area 102.

Figure 8H:
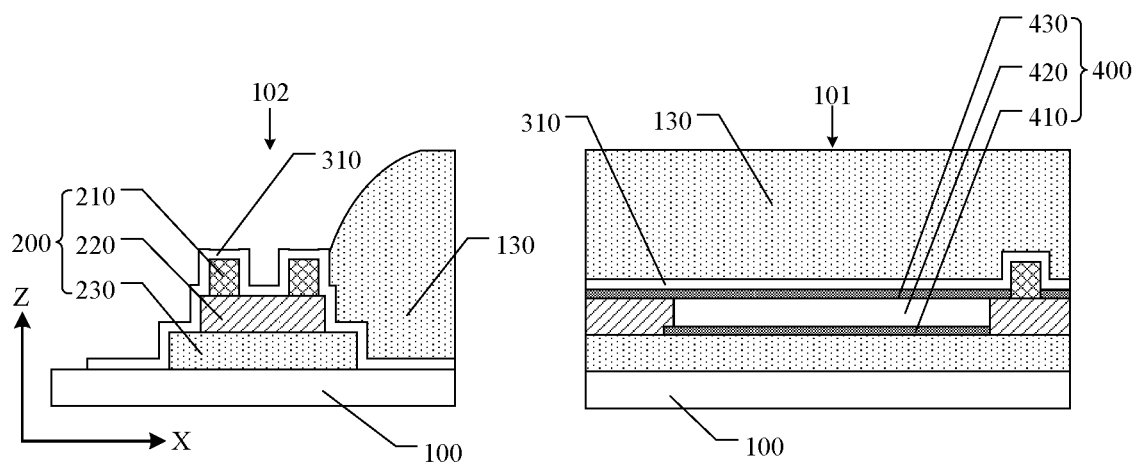

As shown in FIGS. 8G to 8H, a liquid 130 is coated on the substrate 100 on which the first encapsulation layer 310 is formed. For example, the liquid 130 may be coated by means of ink jet printing.

For example, in at least one embodiment of the present disclosure, the liquid may be selected, so that the first encapsulation layer is lyophobic with respect to the liquid. Thus, as shown in FIG. 8H, when the liquid 130 is coated, a liquid level height of the liquid 130 may be made greater than a height of the first encapsulation layer 310 covering the blocking dam 200, so that more liquid may be coated on the substrate. That is, in a case where a design height of the blocking dam is constant, the above design may increase a thickness of a third encapsulation layer to be formed.

Figure 8I:
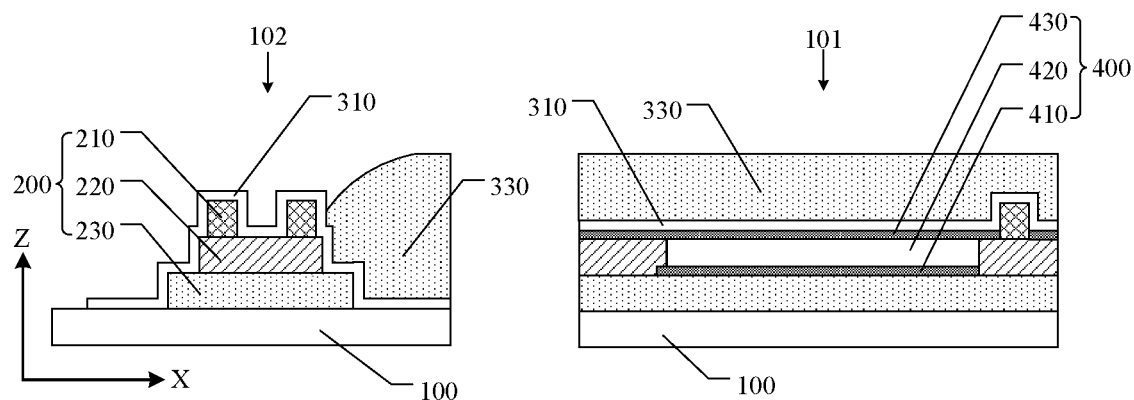

As shown in FIGS. 8H to 8I, the liquid 130 is solidified after being dried to form the third encapsulation layer 330.

As shown in FIG. 5, an inorganic material is deposited on the substrate 100 formed with the third encapsulation layer 330 to form a second encapsulation layer 320, and the second encapsulation layer 320 covers the third encapsulation layer 330 and covers the blocking dam 200 of the frame area 102.

It will be noted that, the drawings of the embodiments of the present disclosure only relate to the structures related to the embodiments of the present disclosure, and for other structures, refer to conventional designs. For clarity, thicknesses of layers or areas are enlarged or reduced in the drawings used to describe the embodiments of the present disclosure, that is, these figures are not drawn to actual scale. Without conflict, the embodiments of the present disclosure and the features in the embodiments may be combined with each other to obtain new embodiments.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having an active area and a frame area located at at least one side of the active area, the display substrate comprising:
   a substrate;
   pixel units disposed on the substrate and located in the active area;
   an isolation column located in the active area;
   a pixel defining layer located in the active area;
   a planarization layer covering at least the active area;
   a plurality of light-emitting devices arranged in an array in the active area;
   at least one blocking dam disposed on the substrate and located in the frame area, at least one groove being provided on a surface of the at least one blocking dam facing away from the substrate;
   a depth direction of the at least one groove being perpendicular to the substrate, and an extending direction of the at least one groove being substantially the same as an extending direction of the at least one blocking dam provided with the at least one groove;
   a conductive pattern located in the frame area; and
   a first encapsulation layer covering the at least one blocking dam;
   wherein the plurality of light-emitting devices are located between the first encapsulation layer and the substrate, each light-emitting device includes a first electrode, a light-emitting functional layer and a second electrode that are sequentially stacked on the planarization layer, and the light-emitting functional layer of each light-emitting device is located in an opening of the pixel defining layer; and
   the conductive pattern and the first electrode of each light-emitting device are disposed in the same layer and have the same material, and an edge of an orthogonal projection of the conductive pattern on the substrate away from the active area is located within a range of an orthogonal projection of the at least one blocking dam on the substrate;
   wherein the at least one blocking dam provided with the at least one groove includes a second pattern layer and a first pattern layer that are sequentially stacked on the substrate, a material of the first pattern layer is different from a material of the second pattern layer, and the at least one groove is located in the first pattern layer;
   the isolation column and the first pattern layer being formed by patterning the same film layer; and
   the pixel defining layer and the second pattern layer being formed by patterning the same film layer;
   wherein the at least one blocking dam further includes a third pattern layer between the second pattern layer and the substrate, and the planarization layer and the third pattern layer are formed by patterning the same film layer; and
   an orthogonal projection of the conductive pattern on the substrate is overlapped with an orthogonal projection of the third pattern layer on the substrate, and is not overlapped with orthogonal projections of the second pattern layer and the first pattern layer on the substrate.

2. The display substrate according to claim 1, wherein a portion of the first encapsulation layer covering the at least one groove is conformal to the at least one groove.

3. The display substrate according to claim 1, wherein
the at least one blocking dam includes at least two blocking dams, and the at least two blocking dams surround the active area and are sequentially arranged from inside to outside; and
the at least one groove is arranged to surround the active area, and an orthogonal projection of the at least one groove on the substrate is in a closed shape.

4. The display substrate according to claim 3, wherein in a direction from a center to an edge of the display substrate, heights of the at least two blocking dams successively increase.

5. The display substrate according to claim 1, wherein at least two grooves surrounding the active area are provided in the at least one blocking dam provided with the at least one groove, and the at least two grooves are sequentially arranged from inside to outside.

6. The display substrate according to claim 1, wherein a plurality of protruding portions are provided in the at least one groove; and in an extending direction of the at least one groove, the plurality of protruding portions are sequentially arranged at intervals.

7. The display substrate according to claim 6, wherein the plurality of protruding portions and a portion of the at least one blocking dam away from the substrate are formed by patterning the same film layer.

8. The display substrate according to claim 6, wherein a shape of an orthogonal projection of the plurality of protruding portions on the substrate is at least one of a triangle, a rectangle, a polygon or a circle.

9. The display substrate according to claim 1, further comprising:
a second encapsulation layer located above a side of the first encapsulation layer away from the substrate, the second encapsulation layer covering the active area and the at least one blocking dam;
a third encapsulation layer located between the first encapsulation layer and the second encapsulation layer, the third encapsulation layer covering at least the active area, wherein
an edge of an orthogonal projection of the at least one blocking dam on the substrate away from the active area is located outside an orthogonal projection of the third encapsulation layer on the substrate.

10. A display device, comprising the display substrate according to claim 1.

11. A manufacturing method for a display substrate, comprising:
providing a substrate having an active area and a frame area located at at least one side of the active area;
forming at least one blocking dam on the substrate and in the frame area, and forming at least one groove on a surface of the at least one blocking dam facing away from the substrate, wherein a depth direction of the at least one groove is perpendicular to the substrate, and an extending direction of the at least one groove is substantially the same as an extending direction of the at least one blocking dam provided with the at least one groove; and
forming a first encapsulation layer on the substrate to cover the active area and the at least one blocking dam;
wherein the at least one blocking dam includes a second pattern layer and a first pattern layer that are sequentially stacked on the substrate, a material of the first pattern layer is different from a material of the second pattern layer, and the at least one groove is formed in the first pattern layer; forming the at least one blocking dam includes:
sequentially depositing a second material layer and a first material layer on the substrate to form stacked layers; and
simultaneously patterning the first material layer and the second material layer by using a halftone mask, wherein
a portion of the first material layer located in the active area is formed into an isolation column, and a portion of the first material layer located in the frame area is formed into the first pattern layer; a portion of the second material layer located in the active area is formed into a pixel defining layer, and a portion of the second material layer located in the frame area is formed into the second pattern layer;
wherein the at least one blocking dam further includes a third pattern layer between the second pattern layer and the substrate; forming the at least one blocking dam further includes:
depositing an insulating material film on the substrate to planarize a surface of the substrate; and
patterning the insulating material film, wherein
a portion of the insulating material film located in the active area is formed into a planarization layer, and a portion of the insulating material film outside the active area is formed into the third pattern layer;
after forming the planarization layer, the method further comprising:
depositing a conductive material layer on the planarization layer;
patterning the conductive material layer, wherein a portion of the conductive material layer located in the active area is formed into a first electrode, a portion of the conductive material layer located in the frame area is formed into a conductive pattern, and an edge of an orthogonal projection of the conductive pattern on the substrate away from the active area is located within a range of an orthogonal projection of the at least one blocking dam on the substrate; the orthogonal projection of the conductive pattern on the substrate is overlapped with an orthogonal projection of the third pattern layer on the substrate, and is not overlapped with orthogonal projections of the second pattern layer and the first pattern layer on the substrate; and
forming a light-emitting functional layer and a second electrodes sequentially, wherein the light-emitting functional layer is located in an opening of the pixel defining layer, the first electrode, the light-emitting functional layer and the second electrode that are sequentially stacked on the substrate constitute a light-emitting device of a plurality of light emitting devices, and the plurality of light-emitting devices are arranged in an array in the active area and located between the first encapsulation layer and the substrate.

12. The method according to claim 11, after forming the first encapsulation layer, the method further comprising:
coating a liquid including an organic material on a portion of the first encapsulation layer located in the active area; and
drying and solidifying the liquid to form a third encapsulation layer.

* * * * *